(12) United States Patent
Chen

(10) Patent No.: US 12,324,100 B2
(45) Date of Patent: Jun. 3, 2025

(54) CIRCUIT BOARD ASSEMBLY AND MANUFACTURING METHOD THEREOF

(71) Applicant: UNIMICRON TECHNOLOGY CORP., Taoyuan (TW)

(72) Inventor: Yu-Shen Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 414 days.

(21) Appl. No.: 17/969,610

(22) Filed: Oct. 19, 2022

(65) Prior Publication Data
US 2024/0064901 A1   Feb. 22, 2024

(30) Foreign Application Priority Data
Aug. 19, 2022 (TW) .................................. 111131219

(51) Int. Cl.
*H05K 1/02* (2006.01)
*H01H 37/04* (2006.01)
(Continued)

(52) U.S. Cl.
CPC ............... *H05K 1/16* (2013.01); *H01H 37/04* (2013.01); *H01H 37/52* (2013.01);
(Continued)

(58) Field of Classification Search
CPC ........ H05K 1/16; H05K 1/0206; H05K 1/186; H05K 2201/066; H05K 2201/10416; H05K 1/0204; H05K 1/185; H05K 1/0203; H05K 1/0213; H05K 3/00; H01H 37/04; H01H 37/52; H01H 2037/525; H01H 2037/528; H01L 21/4857; H01L 21/56; H01L 23/3121; H01L 23/3735; H01L 23/5383; H01L 23/5386; H01L 24/19; H01L 24/20; H01L 25/0657; H01L 24/13; H01L 24/16; H01L 2224/13111; H01L 2224/16227; H01L 2224/19; H01L 2224/211; H01L 2225/06572; H01L 2225/06589; H01L 2225/1023; H01L 2225/1041; H01L 25/105; H01L 25/50; H01L 23/562; H01L 2225/06524; H01L 2225/1035;
(Continued)

(56) References Cited

U.S. PATENT DOCUMENTS

| 4,829,281 A * | 5/1989 | Givler | H01H 37/52 337/368 |
| 6,412,165 B1 * | 7/2002 | White | H01H 37/5418 228/180.1 |
| 2017/0287664 A1* | 10/2017 | Elsherbini | H01H 37/00 |

* cited by examiner

*Primary Examiner* — Ishwarbhai B Patel
(74) *Attorney, Agent, or Firm* — Maschoff Brennan

(57) ABSTRACT

This disclosure provides a circuit board assembly and a manufacturing method thereof. The circuit board assembly includes circuit board, embedded chip, heat dissipation assembly and temperature switch structure. The temperature switch structure includes a first metal layer and a second metal layer stacked on each other. The first metal layer of the temperature switch structure is electrically connected to the circuit board and is thermally coupled to the embedded chip. A thermal expansion coefficient of the first metal layer is different from a thermal expansion coefficient of the second metal layer so that the temperature switch structure is deformed in response to a temperature change of the embedded chip to be in contact with or spaced apart from the second electrically conductive contact of the heat dissipation assembly.

20 Claims, 24 Drawing Sheets

(51) Int. Cl.
| | |
|---|---|
| H01H 37/52 | (2006.01) |
| H01L 21/48 | (2006.01) |
| H01L 21/56 | (2006.01) |
| H01L 23/00 | (2006.01) |
| H01L 23/31 | (2006.01) |
| H01L 23/373 | (2006.01) |
| H01L 23/538 | (2006.01) |
| H01L 25/065 | (2023.01) |
| H05K 1/03 | (2006.01) |
| H05K 1/16 | (2006.01) |
| H05K 1/18 | (2006.01) |
| H05K 3/30 | (2006.01) |

(52) U.S. Cl.
CPC ....... *H01L 21/4857* (2013.01); *H01L 21/56* (2013.01); *H01L 23/3121* (2013.01); *H01L 23/3735* (2013.01); *H01L 23/5383* (2013.01); *H01L 23/5386* (2013.01); *H01L 24/19* (2013.01); *H01L 24/20* (2013.01); *H01L 25/0657* (2013.01); *H05K 1/0206* (2013.01); *H05K 1/183* (2013.01); *H05K 1/186* (2013.01); *H05K 3/30* (2013.01); H01H 2037/525 (2013.01); H01L 24/13 (2013.01); H01L 24/16 (2013.01); H01L 2224/13111 (2013.01); H01L 2224/16227 (2013.01); H01L 2224/19 (2013.01); H01L 2224/211 (2013.01); H01L 2225/06572 (2013.01); H01L 2225/06589 (2013.01); H05K 2201/10053 (2013.01)

(58) Field of Classification Search
CPC ..... H01L 2225/1058; H01L 2225/1094; H01L 23/34; H01L 23/5389; H01L 23/3677
See application file for complete search history.

CIRCUIT BOARD ASSEMBLY AND MANUFACTURING METHOD THEREOF

CROSS-REFERENCE TO RELATED APPLICATIONS

This non-provisional application claims priority under 35 U.S.C. § 119(a) on Patent Application No(s). 111131219 filed in Taiwan, R.O.C. on Aug. 19, 2022, the entire contents of which are hereby incorporated by reference.

TECHNICAL FIELD

The disclosure relates to a circuit board assembly and a manufacturing method thereof, more particularly to a circuit board assembly including a temperature switch structure and a manufacturing method thereof.

BACKGROUND

In a circuit board assembly, since a chip disposed on a circuit board generates a large amount of heat, at least one heat dissipation assembly is usually disposed on the circuit board to cool the chip. In general, the heat dissipation assembly is always electrically connected to the circuit board to be turned on to cool the chip regardless of whether the chip is required to be cooled or not. In this way, the heat dissipation assembly still operate as the chip is not required to be cooled, and thus the heat dissipation assembly causes additional power consumption and the lifespan of the heat dissipation assembly is reduced. In order to prevent such additional power consumption and the reduction of the lifespan, some manufactures detect a temperature change of the chip via a temperature controlling system and turn on or turn off the heat dissipation assembly based on the detected temperature change.

However, such temperature controlling system not only should include temperature sensor, but also should include complex controlling system to turn on or turn off the heat dissipation assembly according to the temperature change of the chip detected by the temperature sensor. In other words, the conventional circuit board assembly is unable to turn on or off the heat dissipation assembly in response to the temperature change of the chip via a simple arrangement.

SUMMARY

The disclosure provides a circuit board assembly and a manufacturing method thereof which are capable of enabling a simple arrangement which can turn on or off a heat dissipation assembly in response to the temperature change of an embedded chip.

One embodiment of this disclosure provides a circuit board assembly including a circuit board, an embedded chip, a heat dissipation assembly and a temperature switch structure. The embedded chip is embedded in and electrically connected to the circuit board. The heat dissipation assembly is disposed on the circuit board and has a first electrically conductive contact and a second electrically conductive contact. The heat dissipation assembly is thermally coupled to the embedded chip. The first electrically conductive contact of the heat dissipation assembly is electrically connected to the circuit board. The temperature switch structure is located between at least a part of the circuit board and the second electrically conductive contact. The temperature switch structure includes a first metal layer and a second metal layer stacked on each other. The first metal layer of the temperature switch structure is electrically connected to the circuit board and is thermally coupled to the embedded chip. A thermal expansion coefficient of the first metal layer is different from a thermal expansion coefficient of the second metal layer so that the temperature switch structure is deformed in response to a temperature change of the embedded chip to be in contact with or spaced apart from the second electrically conductive contact of the heat dissipation assembly.

In an embodiment of the disclosure, the circuit board includes a substrate and a first build-up layer. The first build-up layer includes a dielectric layer, a heat dissipation layer, and a circuit layer. The dielectric layer is disposed on the substrate. The heat dissipation layer, the circuit layer, and the first metal layer of the temperature switch structure are stacked on a side of the dielectric layer that is located farthest away from the substrate. A bonding force between the first metal layer of the temperature switch structure and the dielectric layer is smaller than a bonding force between the circuit layer and the dielectric layer and a bonding force between the heat dissipation layer and the dielectric layer. The embedded chip is embedded in the substrate. The heat dissipation assembly is thermally coupled to the heat dissipation layer. The first electrically conductive contact of the heat dissipation assembly is electrically connected to the circuit layer.

In an embodiment of the disclosure, the first build-up layer further includes an adhesive layer. The adhesive layer is located between the heat dissipation layer and the dielectric layer. The adhesive layer is located between the circuit layer and the dielectric layer. The adhesive layer is not located between the temperature switch structure and the dielectric layer.

In an embodiment of the disclosure, the temperature switch structure further includes at least one thermally conductive via disposed on the dielectric layer and connected to the first metal layer.

In an embodiment of the disclosure, the circuit board further includes a heat dissipation block. Two opposite sides of the heat dissipation block are in thermal contact with the heat dissipation layer of the first build-up layer and the heat dissipation assembly, respectively.

In an embodiment of the disclosure, the circuit board further includes a heat dissipation block. The heat dissipation block penetrates through the heat dissipation layer, the adhesive layer, and the dielectric layer of the first build-up layer. Two opposite sides of the heat dissipation block are in thermal contact with the embedded chip and the heat dissipation assembly, respectively.

In an embodiment of the disclosure, the substrate includes an electrically insulating part, a first thermally conductive part and an electrically conductive part. The electrically insulating part has a recess. The embedded chip is located in the recess. The first thermally conductive part is located on a side of the recess and is in thermal contact with the embedded chip. The electrically conductive part is disposed on the electrically insulating part. The circuit layer, and the temperature switch structure, the embedded chip, and the heat dissipation assembly are electrically connected to the electrically conductive part.

In an embodiment of the disclosure, the at least one thermally conductive via is connected to a part of the electrically conductive part being in direct contact with the embedded chip.

In an embodiment of the disclosure, the at least one thermally conductive via is connected to a part of the electrically conductive part being spaced apart from the embedded chip.

In an embodiment of the disclosure, the substrate further includes a second heat dissipation part connected to the first thermally conductive part. The first thermally conductive part and the second heat dissipation part are in thermal contact with different sides of the embedded chip, respectively.

In an embodiment of the disclosure, the circuit board further includes a heat dissipation block. The heat dissipation block penetrates through the heat dissipation layer, the dielectric layer, and the adhesive layer of the first build-up layer. Two opposite sides of the heat dissipation block are in thermal contact with the first thermally conductive part and the heat dissipation assembly, respectively.

In an embodiment of the disclosure, the heat dissipation block is spaced apart from the temperature switch structure.

In an embodiment of the disclosure, the first metal layer of the temperature switch structure is located closer to the substrate than the second metal layer of the temperature switch structure. The thermal expansion coefficient of the first metal layer of the temperature switch structure is larger than the thermal expansion coefficient of the second metal layer of the temperature switch structure.

In an embodiment of the disclosure, the temperature switch structure further includes a third electrically conductive contact. The third electrically conductive contact protrudes from a side of the second metal layer that is located farthest away from the first metal layer. The temperature switch structure is deformed in response to the temperature change of the embedded chip to allow the third electrically conductive contact of the temperature switch structure to be in contact with or spaced apart from the second electrically conductive contact of the heat dissipation assembly.

In an embodiment of the disclosure, the third electrically conductive contact is in a tapered shape or a prism shape.

Another embodiment of this disclosure provides a manufacturing method of circuit board assembly including a step of providing a circuit board with an embedded chip embedded therein, a step of forming a temperature switch structure on a side of the circuit board and a step of providing a heat dissipation assembly on the side of the circuit board. The temperature switch structure comprises includes a first metal layer and a second metal layer which are stacked on each other. The first metal layer of the temperature switch structure is electrically connected to the circuit board and is thermally coupled to the embedded chip. A thermal expansion coefficient of the first metal layer is different from a thermal expansion coefficient of the second metal layer. The heat dissipation assembly is thermally coupled to the embedded chip. A first electrically conductive contact of the heat dissipation assembly is electrically connected to the circuit board. The temperature switch structure is located between a second electrically conductive contact of the heat dissipation assembly and at least a part of the circuit board.

In an embodiment of the disclosure, providing the circuit board with the embedded chip embedded therein includes a step of providing the embedded chip into a substrate of the circuit board, a step of forming a dielectric layer on the substrate and defining a first area and a second area on the dielectric layer, a step of performing a bonding enhancement process on the first area of the dielectric layer, and a step of providing a heat dissipation layer and a circuit layer on the first area of the dielectric layer. Forming the temperature switch structure on a side of the circuit board includes a step of forming the temperature switch structure on the second area.

In an embodiment of the disclosure, the bonding enhancement process includes a step of forming an adhesive layer on the first area of the dielectric layer.

In an embodiment of the disclosure, the bonding enhancement process includes a step of performing a surface treatment on the first area of the dielectric layer to increase a surface roughness of the first area.

In an embodiment of the disclosure, the first metal layer of the temperature switch structure is located closer to the substrate than the second metal layer of the temperature switch structure. The thermal expansion coefficient of the first metal layer of the temperature switch structure is larger than the thermal expansion coefficient of the second metal layer of the temperature switch structure.

According to the circuit board assembly and the manufacturing method thereof disclosed by above embodiments, the thermal expansion coefficient of the first metal layer is different from the thermal expansion coefficient of the second metal layer, and the first metal layer is thermally coupled to the embedded chip. Thus, the temperature switch structure is deformed in response to the temperature change of the embedded chip to be in contact with or spaced apart from the second electrically conductive contact of the heat dissipation assembly. Specifically, the temperature switch structure is in contact with the second electrically conductive contact when the temperature of the embedded chip is high to turn on the heat dissipation assembly to start cooling the embedded chip. The temperature switch structure is spaced apart from the second electrically conductive contact when the temperature of the embedded chip is low to turn off the heat dissipation assembly to stop cooling the embedded chip. Accordingly, the heat dissipation assembly can be turned on and turned off in response to the temperature change of the embedded chip without any temperature sensor or complex control system, thereby achieving an efficacy of low cost and energy saving and prolonging the lifespan of the heat dissipation assembly.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
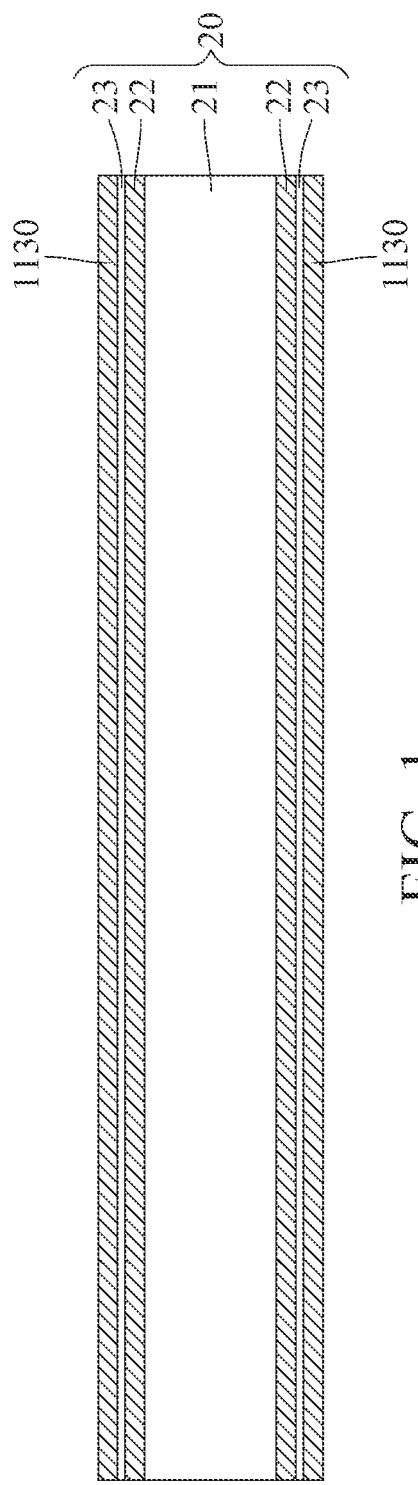
FIGS. 1 to 19 are cross-sectional views showing a manufacturing method of a circuit board assembly according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The foregoing and other technical content, features, and effects of the disclosure can be clearly presented below in detailed description with reference to embodiments of the accompanying drawings. The directional terms mentioned herein, like "above", "below", "front", "back", "left", and "right", refer to the directions in the accompanying drawings. Therefore, the directional terms are only used for illustration instead of limiting the disclosure.

In the detailed description of the embodiments, the terms, like "first", "second", and "third", may be used for describing different elements. The terms are merely used for distinguishing between the elements or layers, but these elements or layers should not be limited by these terms in a structure. For example, a first element or layer may be referred to as a second element or layer, moreover, similarly, the second element or layer may be referred to as the first element or layer without departing from the protection scope of the ideas of the disclosure. In addition, in the manufacturing method, the formation sequence of the elements or components should also not be limited by these terms except specific manufacturing processes. For example, the first element or layer may be formed before the second element or layer, or the first element or layer may be formed after the second element or layer, or the first element or layer and the second element layer may be formed in the same process or step.

In addition, the thickness of layers and regions in the drawings may be enlarged for clarity. The same or similar reference numbers are used for representing the same or similar components, and these descriptions are not repeated below again.

Please refer to FIGS. 1 to 19. FIGS. 1 to 19 are cross-sectional views showing a manufacturing method of a circuit board assembly 10 according to a first embodiment of the disclosure. A manufacturing method of the circuit board assembly 10 (as shown in FIG. 19) includes following steps.

As shown in FIG. 1, a base 20 is provided and two electrically conductive layers 1130 are formed on two opposite sides of the base 20. The base 20 includes a core layer 21, two electrically conductive layers 22, and two release layers 23. Two electrically conductive layers 22 are stacked on two opposite sides of the core layer 21, respectively. The two release layers 23 are stacked on sides of the two electrically conductive layers 22 that are located farthest away from the core layer 21, respectively. The two electrically conductive layers 1130 are stacked on sides of the two release layers 23 that are located farthest away from the core layer 21, respectively. In some embodiments, the core layer 21 may include a polymer glass fiber composite substrate, a glass substrate, a ceramic substrate, an insulating silicon substrate, or a polyimide (PI) glass fiber composite substrate. However, the disclosure is not limited thereto, as long as the core layer 21 is adapted to carry a film layer formed thereon or a component disposed thereon in the subsequent manufacturing process, the core layer 21 may include any types of substrates. In addition, the electrically conductive layer 22 and the release layer 23 may be made of any suitable release and electrically conductive material.

Figure 2:
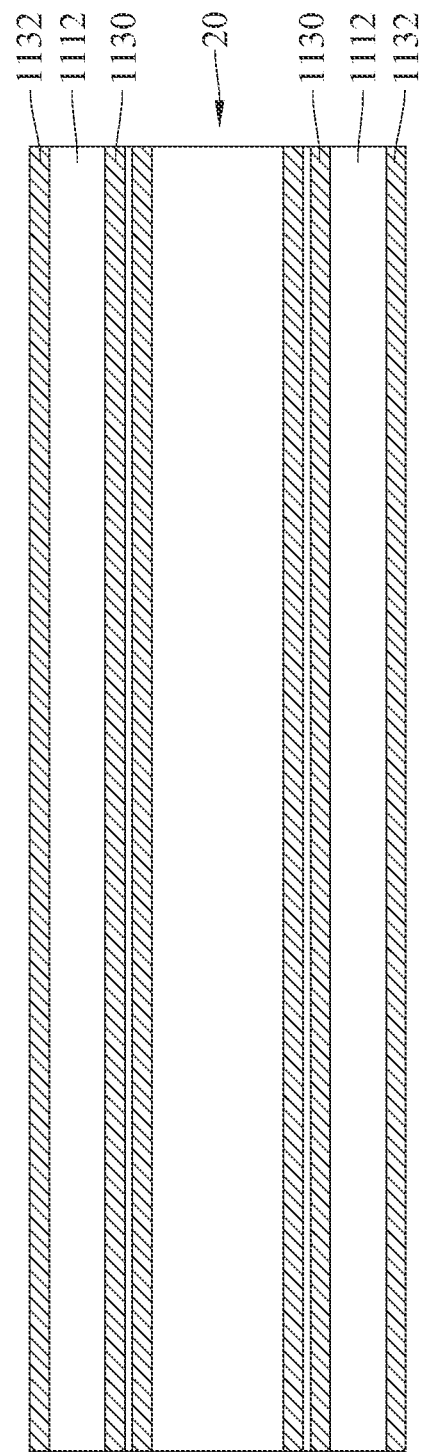

As shown in FIG. 2, an insulating layer 1112 and an electrically conductive layer 1132 are sequentially formed on each of the two electrically conductive layers 1130.

Figure 3:
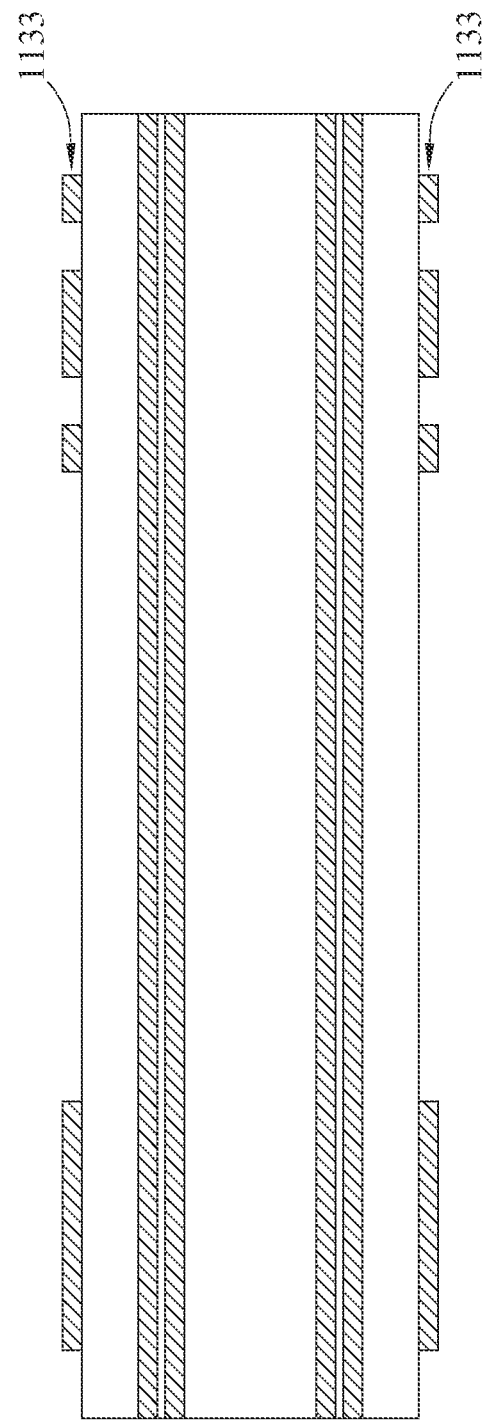

Then, as shown in FIGS. 2 and 3, the electrically conductive layer 1132 is patterned into a circuit layer 1133.

Figure 4:
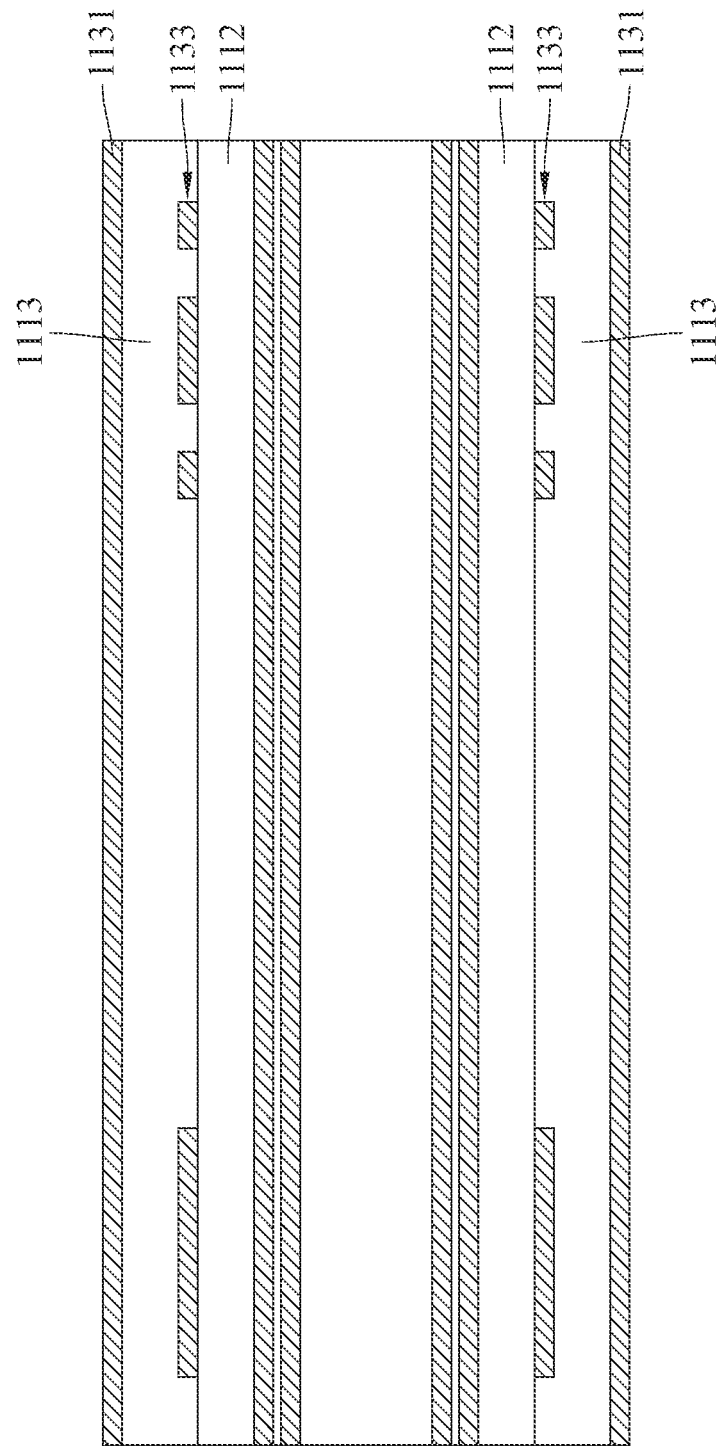

Then, as shown in FIG. 4, an insulating layer 1113 and an electrically conductive layer 1131 are sequentially formed on the circuit layer 1133 and the insulating layer 1112.

Figure 5:
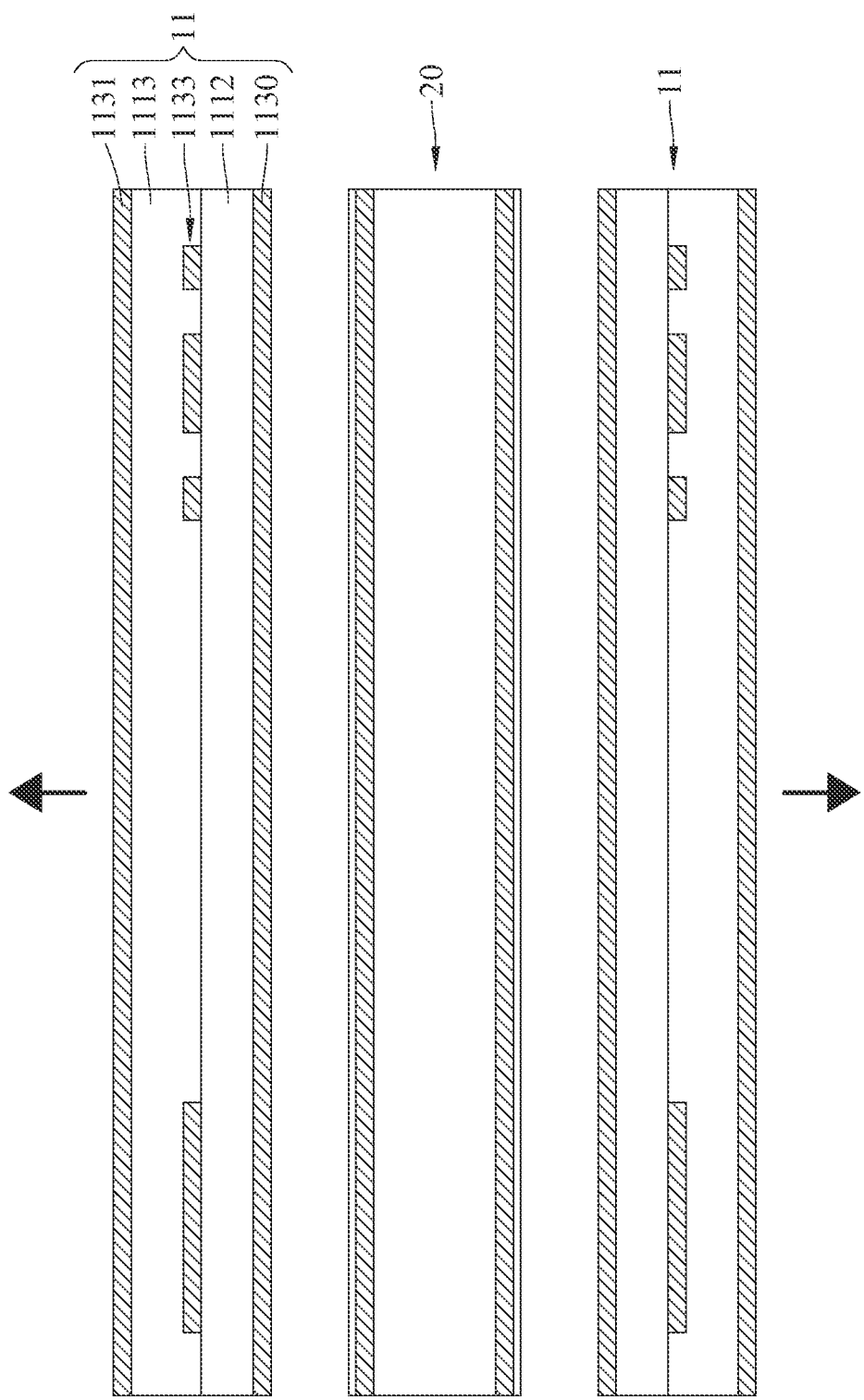

Then, as shown in FIG. 5, the base 20 is removed to obtain two laminations of the electrically conductive layer 1130, the insulating layer 1112, insulating layer 1113, the circuit layer 1133, and the electrically conductive layer 1131, with such laminations are each called a wiring substrate 11.

The wiring substrates 11 may then go through similar or the same processes which will be described below.

Figure 6:
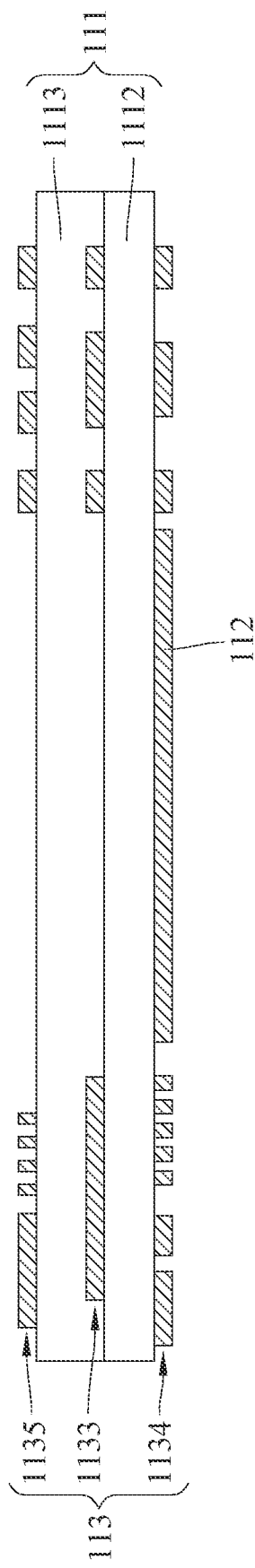

As shown in FIGS. 5 and 6, the electrically conductive layer 1130 and the electrically conductive layer 1131 of the wiring substrate 11 are patterned into a circuit layer 1134 and a circuit layer 1135, respectively. By doing so, a first thermally conductive part 112 is formed on the insulating layer 1112. Herein, the circuit layers 1133, 1134 and 1135 are referred as an electrically conductive part 113, and the insulating layers 1112 and 1113 are referred as an electrically insulating part 111. In this embodiment, the electrically conductive part 113 is disposed on the electrically insulating part 111. In other embodiments, the electrically conductive layer may be formed after the step of removing the base as shown in FIG. 5.

Figure 7:
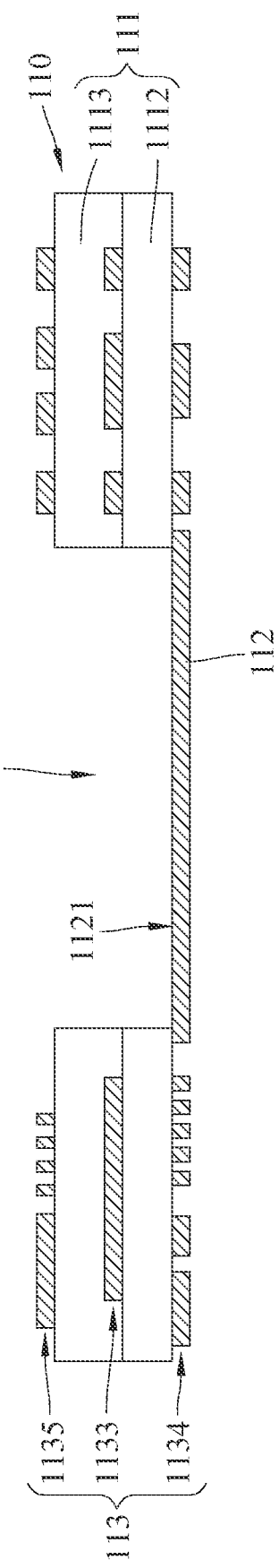

As shown in FIG. 7, a recess 1111 is formed on the electrically insulating part 111. Herein, the electrically insulating part 111 with the recess 1111, the first thermally conductive part 112, and the electrically conductive part 113 can be referred as a substrate 110. That is, the substrate 110 is manufactured. The first thermally conductive part 112 is located on a side of the recess 1111. In more detail, the recess 1111 exposes part of a top surface 1121 of the first thermally conductive part 112.

Figure 8:
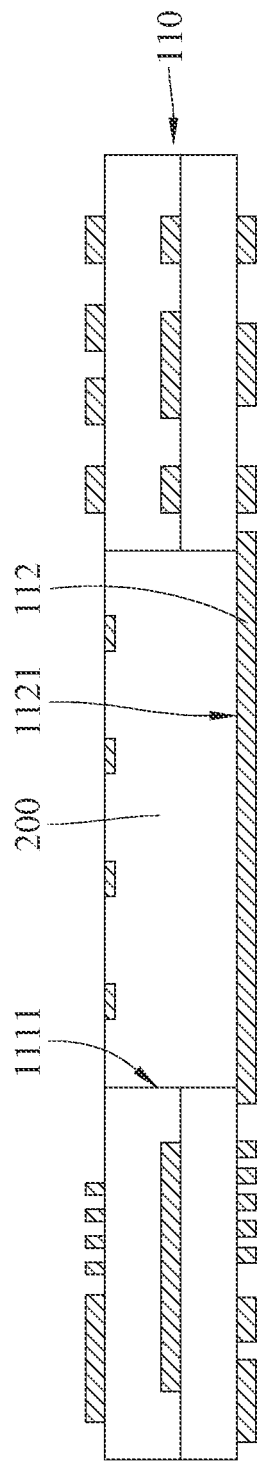

As shown in FIG. 8, an embedded chip 200 is placed into the recess 1111 of the substrate 110; that is, the embedded chip 200 is embedded into the substrate 110. The embedded chip 200 is in thermal contact with the top surface 1121 of the first thermally conductive part 112. Note that in this disclosure, the term "in thermal contact with" used herein means one element is "thermally coupled and in direct contact with" another element.

Figure 9:
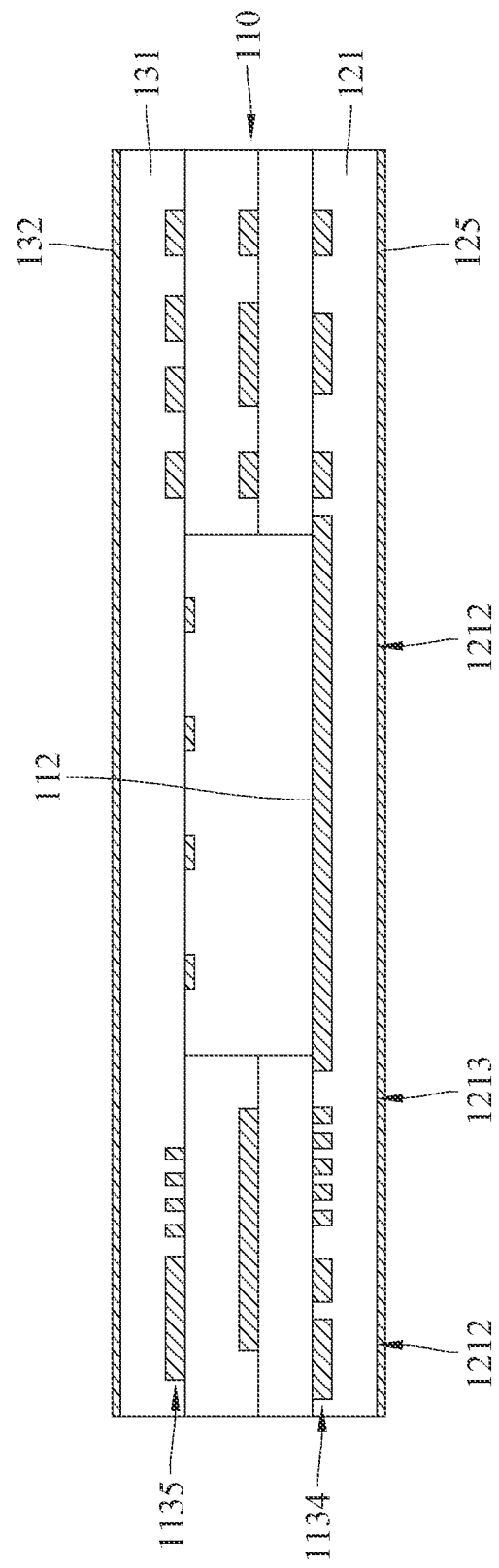

As shown in FIG. 9, a dielectric layer 121 and an electrically conductive layer 125 are sequentially formed on the circuit layer 1134 and the first thermally conductive part 112 of the substrate 110, and a dielectric layer 131 and an electrically conductive layer 132 are sequentially formed on the circuit layer 1135. A first area 1212 and a second area 1213 are defined on the dielectric layer 121.

Figure 10:
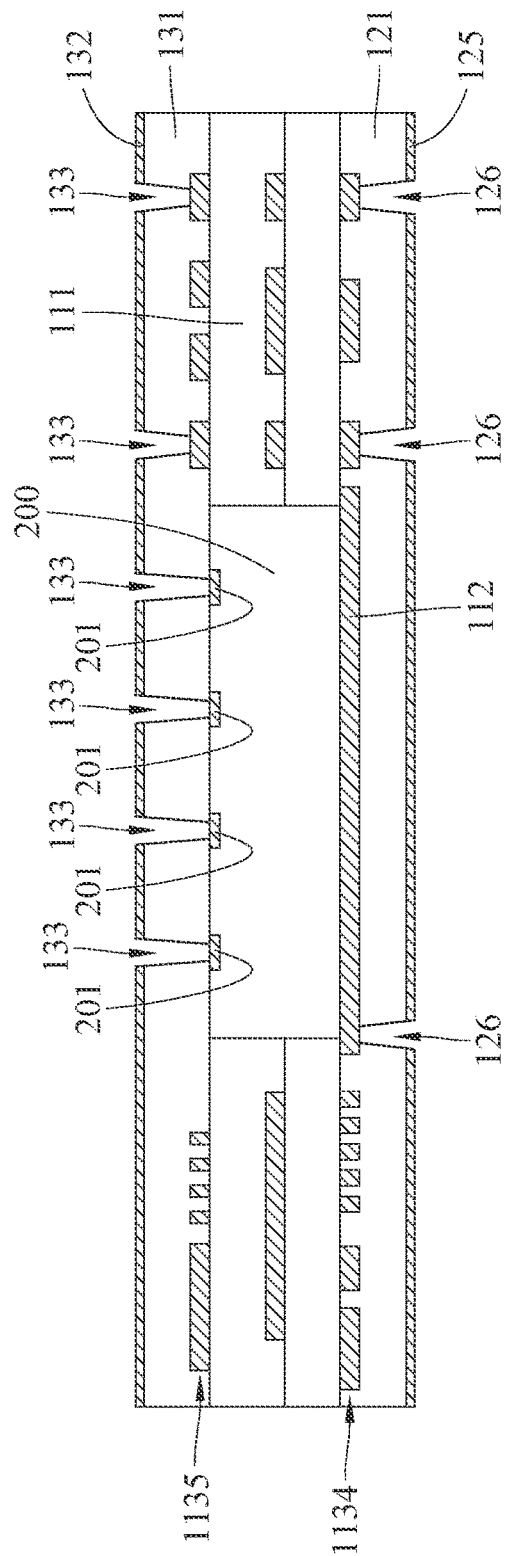

As shown in FIG. 10, a plurality of blind holes 126 are formed on the dielectric layer 121 and penetrating through the electrically conductive layer 125, and a plurality of blind holes 133 are formed on the dielectric layer 131 and penetrating through the electrically conductive layer 132. At least one of the blind holes 126 exposes the first thermally conductive part 112, and the at least one of the blind holes 126 exposes the circuit layer 1134. Some of the blind holes 133 expose a plurality of electrically conductive contacts 201 of the embedded chip 200, and the other blind holes 133 expose the circuit layer 1135.

Figure 11:
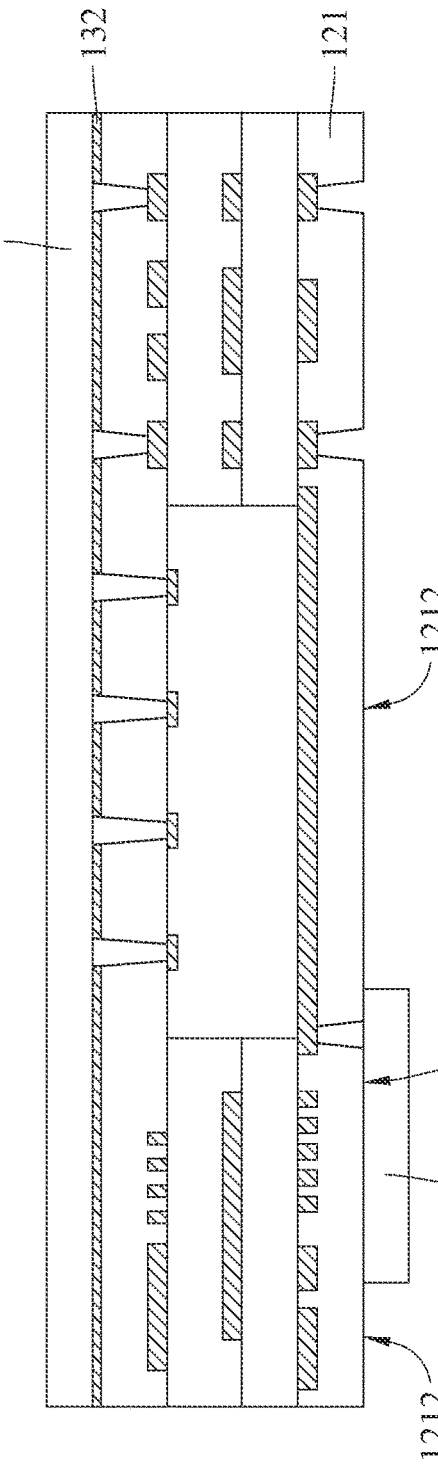

As shown in FIGS. 10 and 11, the electrically conductive layer 125 is removed, a mask 30 is provided to cover the electrically conductive layer 132, and a mask 31 is provided to at least cover the second area 1213 of the dielectric layer 121. Note that a part of the dielectric layer 121 in FIG. 11 that is not covered by the mask 31 is defined as the first area 1212.

Figure 12:
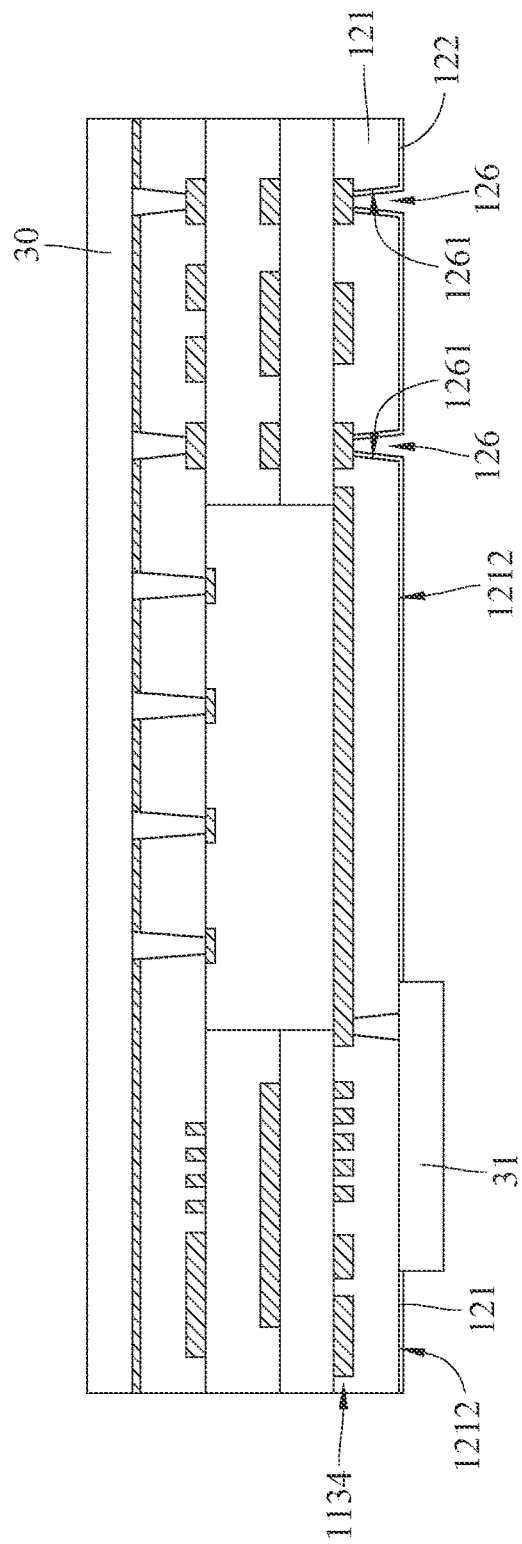

As shown in FIG. 12, a bonding enhancement process is performed on the first area 1212 of the dielectric layer 121. In this embodiment, the bonding enhancement process includes forming an adhesive layer 122 on the first area 1212 of the dielectric layer 121 and sidewalls 1261 of the dielectric layer 121 which form the blind holes 126. In this embodiment, the adhesive layer 122 may be any suitable glue or adhesive promoter.

Figure 13:
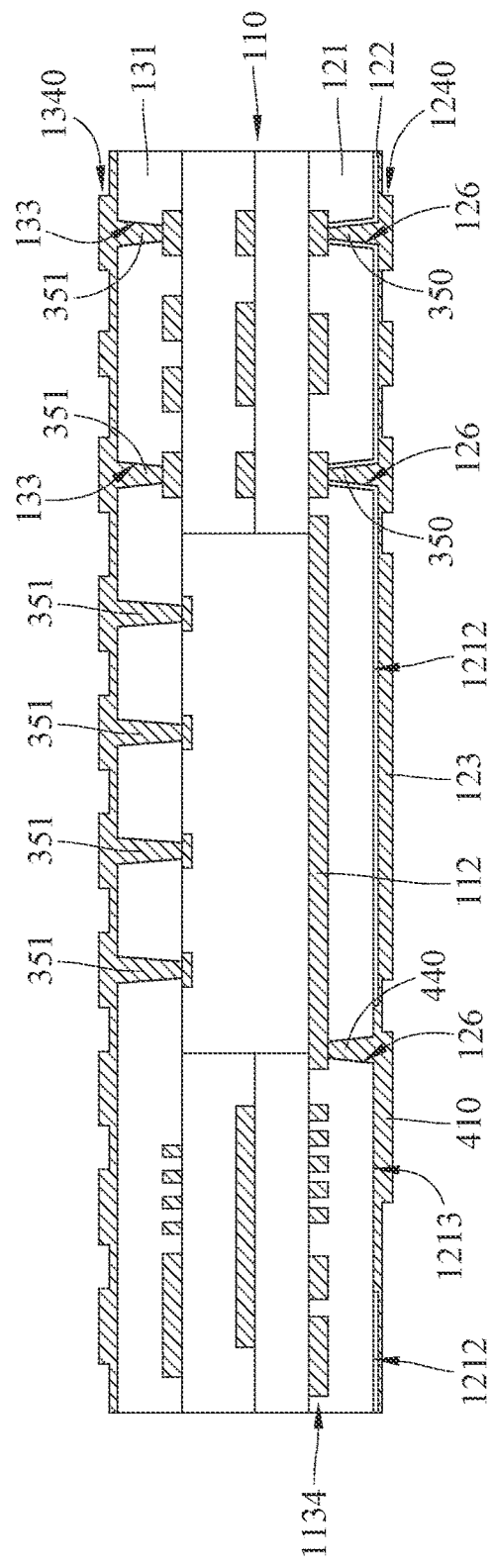

As shown in FIGS. 12-13, a film covering process, exposure process, and electroplating process are performed on the masks 30 and 31, and then a stripping process is performed to remove the masks 30 and 31. By doing so, a heat dissipation layer 123, an electrically conductive layer 1240, a first metal layer 410, a thermally conductive via 440, and a plurality of electrically conductive vias 350 are formed on the dielectric layer 121. A plurality of electrically conductive vias 351 and an electrically conductive layer 1340 are formed on the dielectric layer 131. The heat dissipation layer 123 and the electrically conductive layer 1240 are disposed on the first area 1212 via the adhesive layer 122. The first metal layer 410 is located on the second area 1213 of the dielectric layer 121. The thermally conductive via 440 is located in the blind hole 126 that was configured to expose the first thermally conductive part 112. The electrically conductive vias 350 are respectively located in the blind holes 126 that were configured to expose the circuit layer 1134. The electrically conductive vias 351 are located in the blind holes 133, respectively. The electrically conductive layer 1340 is located on the dielectric layer 131.

Figure 14:
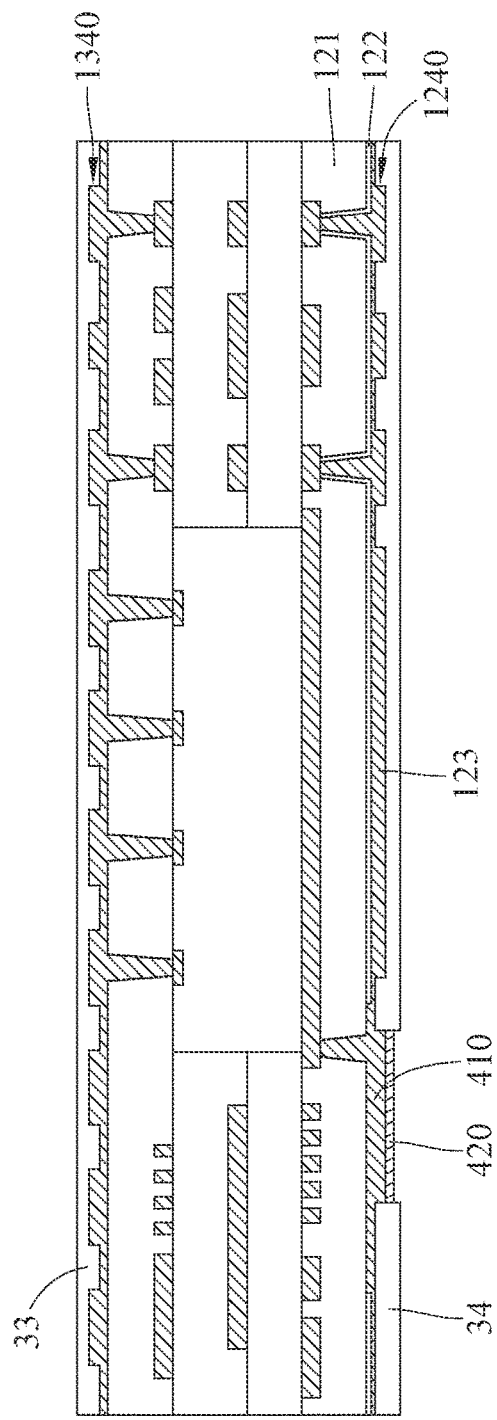

As shown in FIG. 14, a mask 33 is provided to cover the electrically conductive layer 1340, a mask 34 is provided to cover the heat dissipation layer 123 and the electrically conductive layer 1240 except for the first metal layer 410. Then, a second metal layer 420 is formed to cover the first metal layer 410. As shown, the first metal layer 410 is located closer to the substrate 110 than the second metal layer 420, and a thermal expansion coefficient of the first metal layer 410 is greater than a thermal expansion coefficient of the second metal layer 420.

Figure 15:
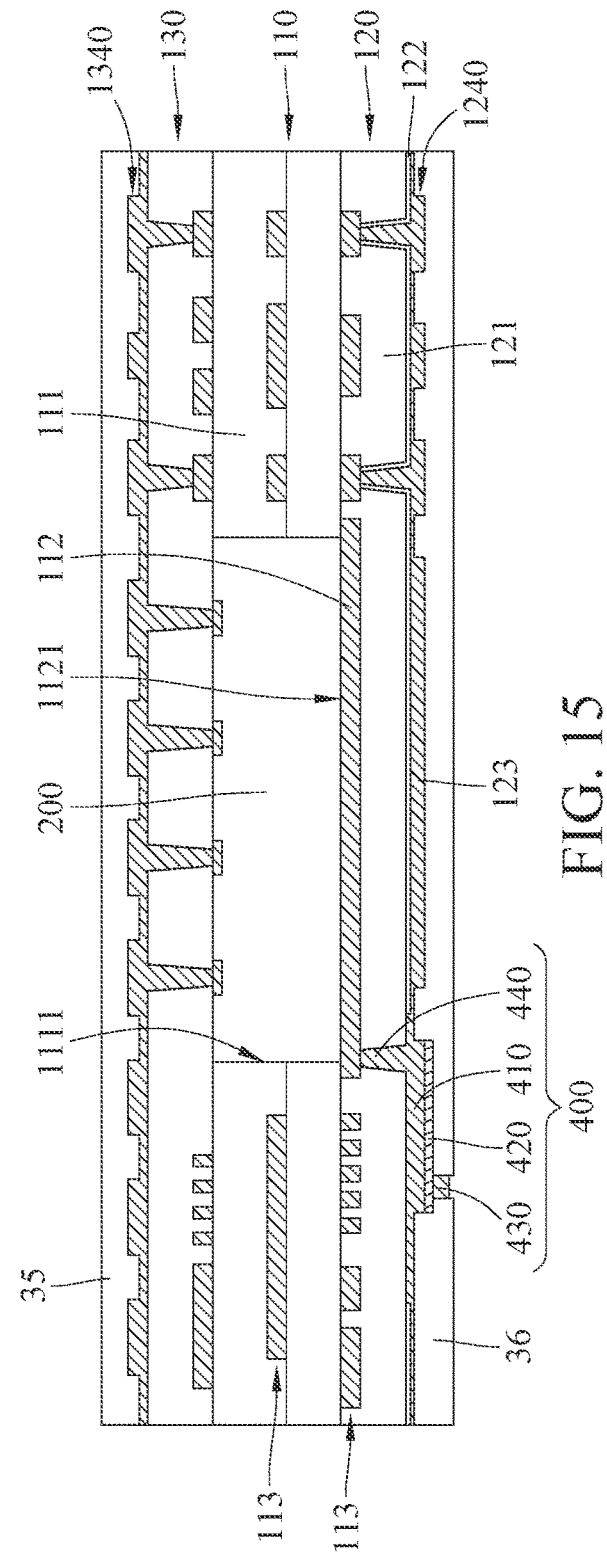

As shown in FIGS. 14-15, the masks 33 and 34 are removed, and then a mask 35 is provided to cover the electrically conductive layer 1340, and a mask 36 is provided to cover the heat dissipation layer 123, the electrically conductive layer 1240, and a part of the second metal layer 420. A third electrically conductive contact 430 is formed to cover the part of the second metal layer 420 not covered by the mask 36. Herein, the first metal layer 410, the second metal layer 420, the third electrically conductive contact 430, and the thermally conductive via 440 are referred as a temperature switch structure 400, where the third electrically conductive contact 430 protrudes outward from a side of the second metal layer 420 that is located farthest away from the first metal layer 410.

Figure 16:
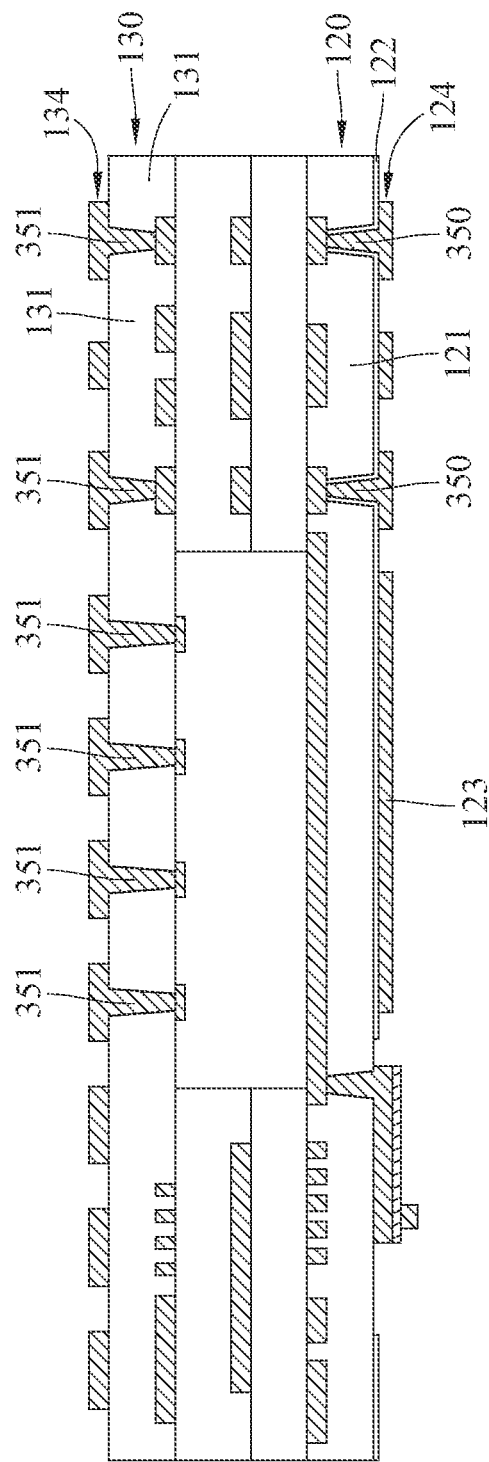

As shown in FIGS. 15-16, the masks 35 and 36 and a part of the each of the electrically conductive layers 1240 and 1340 are removed to form circuit layers 134 and 124, thereby forming a first build-up layer 120 and a second build-up layer 130. As shown, the first build-up layer 120 includes the dielectric layer 121, the adhesive layer 122, the heat dissipation layer 123, the circuit layer 124, and the electrically conductive vias 350, and the second build-up layer 130 includes the dielectric layer 131, the circuit layer 134, and the electrically conductive via 351.

Figure 17:
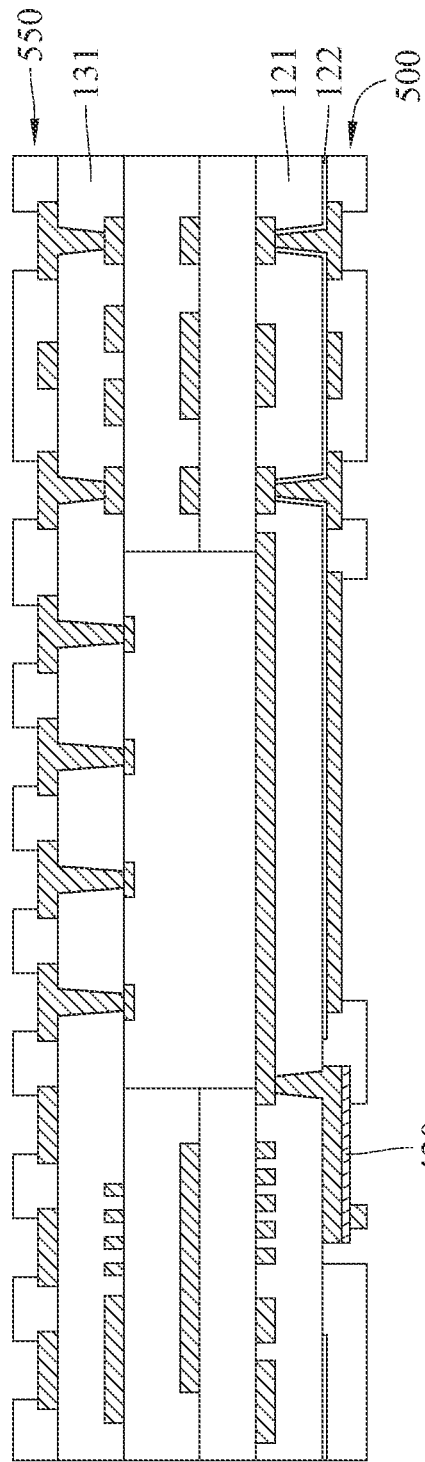

As shown in FIGS. 16-17, a first electrically insulating protective layer 500 and a second electrically insulating protective layer 550 are formed. Specifically, the first electrically insulating protective layer 500 is formed to cover the dielectric layer 121, the adhesive layer 122, and a part of the second metal layer 420. The second electrically insulating protective layer 550 is formed to cover the dielectric layer 131.

Figure 18:
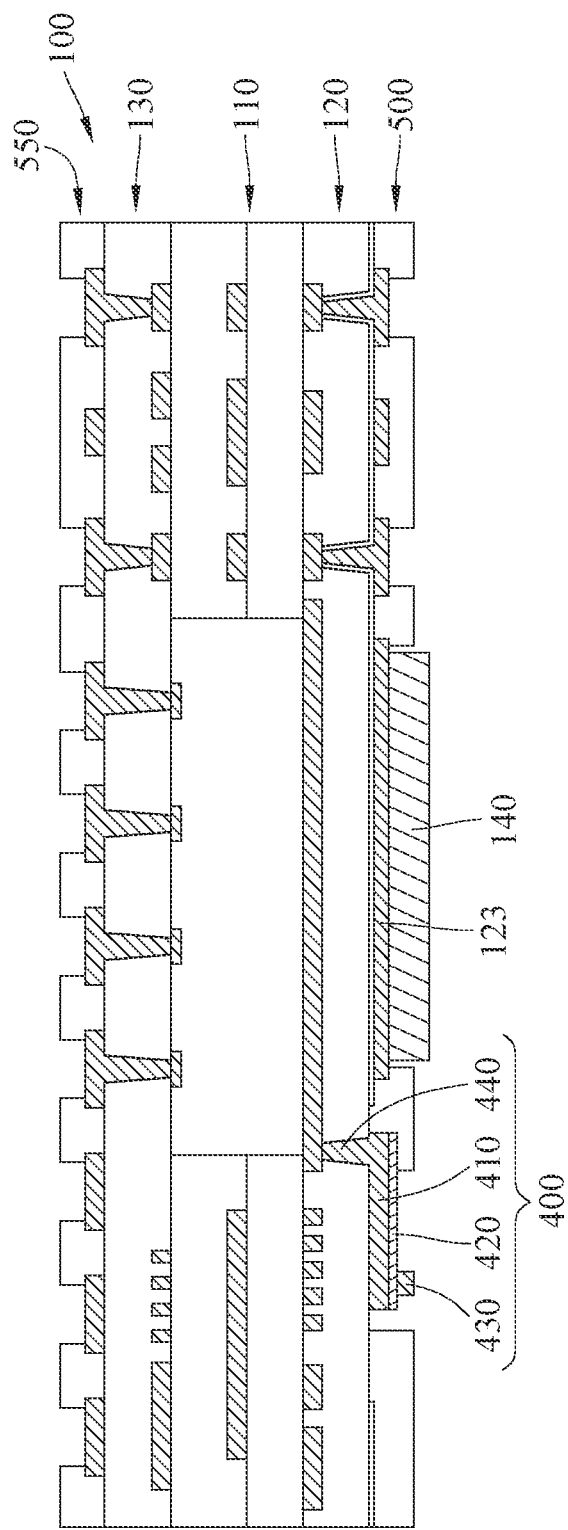
Figure 19:
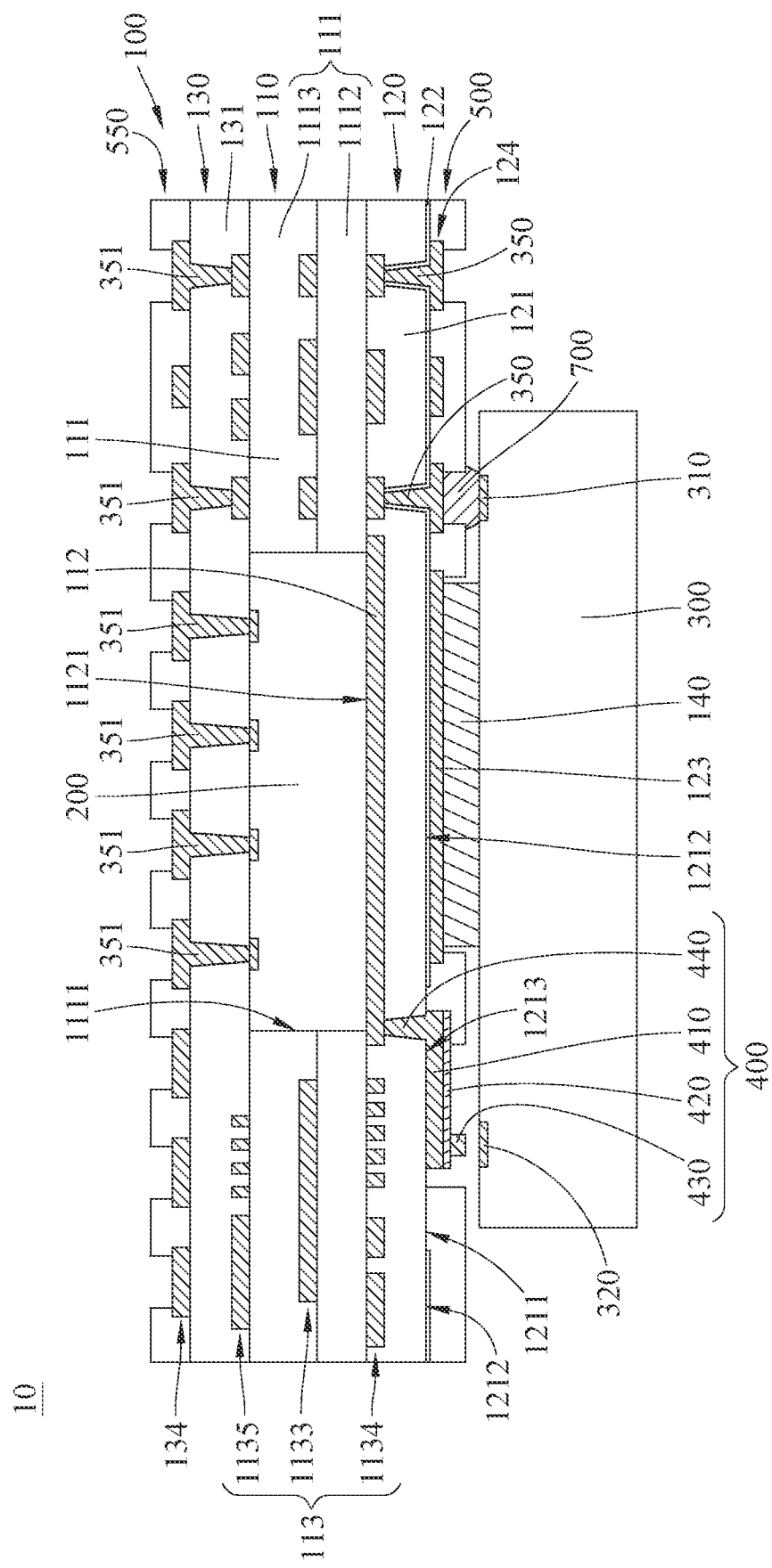

As shown in FIG. 18, a heat dissipation block 140 is formed on the heat dissipation layer 123, and the heat dissipation block 140 is spaced apart from the temperature switch structure 400.

In summary, a circuit board 100 that includes the substrate 110, the first build-up layer 120, the second build-up layer 130, the heat dissipation block 140, the first electrically insulating protective layer 500, and the second electrically insulating protective layer 550 and is embedded with an embedded chip 200 is obtained through the steps as illustrated in FIGS. 1 to 13 and FIGS. 16 to 18, and the formation of a temperature switch structure 400 on a side of the circuit board 100 is obtained through the steps as illustrated in FIGS. 13 to 15. Note that the steps for providing a circuit board 100 and the steps for forming a temperature switch structure 400 may be performed in a required order. In this embodiment, detail steps included in the step of providing the circuit board 100 embedded with the embedded chip 200 and detail steps included in the step of forming the temperature switch structure 400 on a side of the circuit board 100 are alternatively performed, and some detail steps included in the step of providing the circuit board 100 embedded with the embedded chip 200 and some detail steps included in the step of forming the temperature switch structure 400 on a side of the circuit board 100 are simultaneously performed. However, the disclosure is not limited thereto. In other embodiments, all of the detail steps included in the step of forming the temperature switch structure 400 may be performed after all of the detail steps included in the step of providing the circuit board 100 embedded with the embedded chip 200.

In this embodiment, the circuit board 100 includes the substrate 110, the first build-up layer 120, the second build-up layer 130, the heat dissipation block 140, the first electrically insulating protective layer 500, and the second electrically insulating protective layer 550.

In this embodiment, the temperature switch structure 400 includes the first metal layer 410, the second metal layer 420, the third electrically conductive contact 430, and the thermally conductive via 440. The first metal layer 410 of the temperature switch structure 400 is electrically connected to the circuit board 100 and is thermally coupled to the embedded chip 200. Note that the term "thermally coupled" used herein means any type of heat transfer, such as conduction, convection, radiation, or an arbitrary combination thereof, occurs between elements.

As shown in FIG. 19, a heat dissipation assembly 300 is disposed on a side of the circuit board 100 and therefore form a circuit board assembly 10. As shown, the circuit board assembly 10 includes the circuit board 100, the embedded chip 200, the heat dissipation assembly 300, and the temperature switch structure 400. The heat dissipation assembly 300 is in thermal contact with the heat dissipation block 140. Thus, the heat dissipation assembly 300 is able to be thermally coupled to the embedded chip 200 via the heat dissipation block 140, the heat dissipation layer 123, the dielectric layer 121, and the first thermally conductive part 112. The first electrically conductive contact 310 of the heat dissipation assembly 300 is electrically connected to the circuit layer 124 of the first build-up layer 120 of the circuit board 100 via a solder ball 700 (e.g., a tin solder ball). The temperature switch structure 400 is located between the second electrically conductive contact 320 of the heat dissipation assembly 300 and a part of the circuit board 100. In this embodiment, two opposite sides of the heat dissipation block 140 are in thermal contact with the heat dissipation layer 123 of the first build-up layer 120 and the heat dissipation assembly 300, respectively. In this embodiment, the circuit layer 124, the temperature switch structure 400, the embedded chip 200, and the heat dissipation assembly 300 are electrically connected to the electrically conductive part 113.

As discussed, the disclosure provides a circuit board assembly 10 including the circuit board 100, the embedded chip 200, the heat dissipation assembly 300, and the temperature switch structure 400. The embedded chip 200 is embedded in and electrically connected to the circuit board 100. The heat dissipation assembly 300 is disposed on the circuit board 100, and has a first electrically conductive contact 310 and a second electrically conductive contact 320. The heat dissipation assembly 300 is thermally coupled to the embedded chip 200, and the first electrically conductive contact 310 of the heat dissipation assembly 300 is electrically connected to the circuit board 100. The temperature switch structure 400 is located between at least a part of the circuit board 100 and the second electrically conductive contact 320. The temperature switch structure 400 includes the first metal layer 410 and the second metal layer 420 stacked on each other. The first metal layer 410 of the temperature switch structure 400 is electrically connected to the circuit board 100 and is thermally coupled to the embedded chip 200, and the thermal expansion coefficient of the first metal layer 410 is different from the thermal expansion coefficient of the second metal layer 420. Thus, the temperature switch structure 400 is deformed by the temperature change of the embedded chip 200 so that the third electrically conductive contact 430 of the temperature switch structure 400 is in contact with or spaced apart from the second electrically conductive contact 320 of the heat dissipation assembly 300.

In this embodiment, the circuit board 100 includes the substrate 110, the first build-up layer 120, the second build-up layer 130, the heat dissipation block 140, the first electrically insulating protective layer 500 and the second electrically insulating protective layer 550. In this embodiment, the first thermally conductive part 112 is electrically connected to the electrically conductive part 113. That is, the first thermally conductive part 112 is not only thermally conductive, but also is electrically conductive. In this embodiment, the heat dissipation block 140 is stacked on a side of the heat dissipation layer 123 that is located farthest away from the first build-up layer 120.

In this embodiment, the first thermally conductive part 112 is located on a side of the insulating layer 1112 that is located farthest away from the insulating layer 1113, but the disclosure is not limited thereto. In other embodiments, the first thermally conductive part may be located between two insulating layers of the electrically insulating part.

In this embodiment, the heat dissipation block 140 is spaced apart from the temperature switch structure 400 so that the heat dissipation block 140 and the temperature switch structure 400 provide two separate thermally conductive paths between the embedded chip 200 and the heat dissipation assembly 300. Thus, the heat transfer efficiency between the embedded chip 200 and the heat dissipation assembly 300 is increased without affecting the deformation of the temperature switch structure 400 (i.e., the operation of turning on or turning off the heat dissipation assembly 300 by the temperature switch structure 400). However, the disclosure is not limited thereto. In other embodiments, the heat dissipation block may be in contact with a part of the temperature switch structure.

In this embodiment, the first build-up layer 120 includes the heat dissipation layer 123, but the disclosure is not limited thereto. In other embodiments, the first build-up layer may not include the heat dissipation layer, and the heat dissipation block may be in thermal contact with the adhesive layer.

In this embodiment, the temperature switch structure 400 includes the first metal layer 410, the second metal layer 420, the third electrically conductive contact 430 and the thermally conductive via 440. In this embodiment, the thermally conductive via 440 penetrates through the dielectric layer 121 of the first build-up layer 120 and is connected to the first metal layer 410. Specifically, in this embodiment, the thermally conductive via 440 is in thermal contact with the first metal layer 410. In addition, in this embodiment, the thermally conductive via 440 is in thermal contact with the first thermally conductive part 112 that is in direct contact with the embedded chip 200, and is electrically connected to the electrically conductive part 113 via the first thermally conductive part 112. In this embodiment, the heat dissipation layer 123, the circuit layer 124 and the first metal layer 410 are stacked on a side of the dielectric layer 121 that is located farthest away from the substrate 110.

In this embodiment, the dielectric layer 121 has a bonding surface 1211 facing away from the substrate 110. The bonding surface 1211 includes the first area 1212 and the second area 1213. With the adhesive layer 122 of the first build-up layer 120, a bonding force between the first metal layer 410 and the second area 1213 of the dielectric layer 121 is smaller than a bonding force between the circuit layer 124 and the first area 1212 of the dielectric layer 121 and a bonding force between the heat dissipation layer 123 and the first area 1212 of the dielectric layer 121.

In this embodiment, the adhesive layer 122 is disposed on the first area 1212. Thus, the adhesive layer 122 is located between the heat dissipation layer 123 and the dielectric layer 121, and located between the circuit layer 124 and the dielectric layer 121, but is not located between the temperature switch structure 400 and the dielectric layer 121. That is, a part of the adhesive layer 122 is located between the heat dissipation layer 123 and the dielectric layer 121, and a part of the adhesive layer 122 is located between the circuit layer 124 and the dielectric layer 121, but the entire of the adhesive layer 122 is not located between the temperature switch structure 400 and the dielectric layer 121.

In this embodiment, the insulating layers 1112 and 1113 and the dielectric layers 121 and 131 may be made of resin or ceramic, such as prepreg. In some embodiments, the insulating layers 1112 and 1113 and the dielectric layers 121 and 131 may, for example, be formed through a lamination process of resin (for example, epoxy or other similar thermosetting cross-linked resin), silane (for example, hexamethyldisiloxane (HMDSN), tetraethoxysilane (TEOS), bis (dimethylamino) dimethylsilane (BDMADMS)), or other suitable dielectric materials, but the disclosure is not limited thereto.

In an embodiment, the embedded chip 200 may be attached in the recess 1111 by using an adhesive layer, so that the crack caused by the aging of an intermetallic compound (IMC) when the embedded chip 200 is connected by using solder may be prevented, thereby effectively improving the yield and reliability of the circuit board assembly 10. A material of the said adhesive layer is, for example, a photosensitive adhesive. However, the disclosure is not limited thereto, and the embedded chip 200 may also be disposed in the recess 1111 in other suitable methods.

Figure 20:
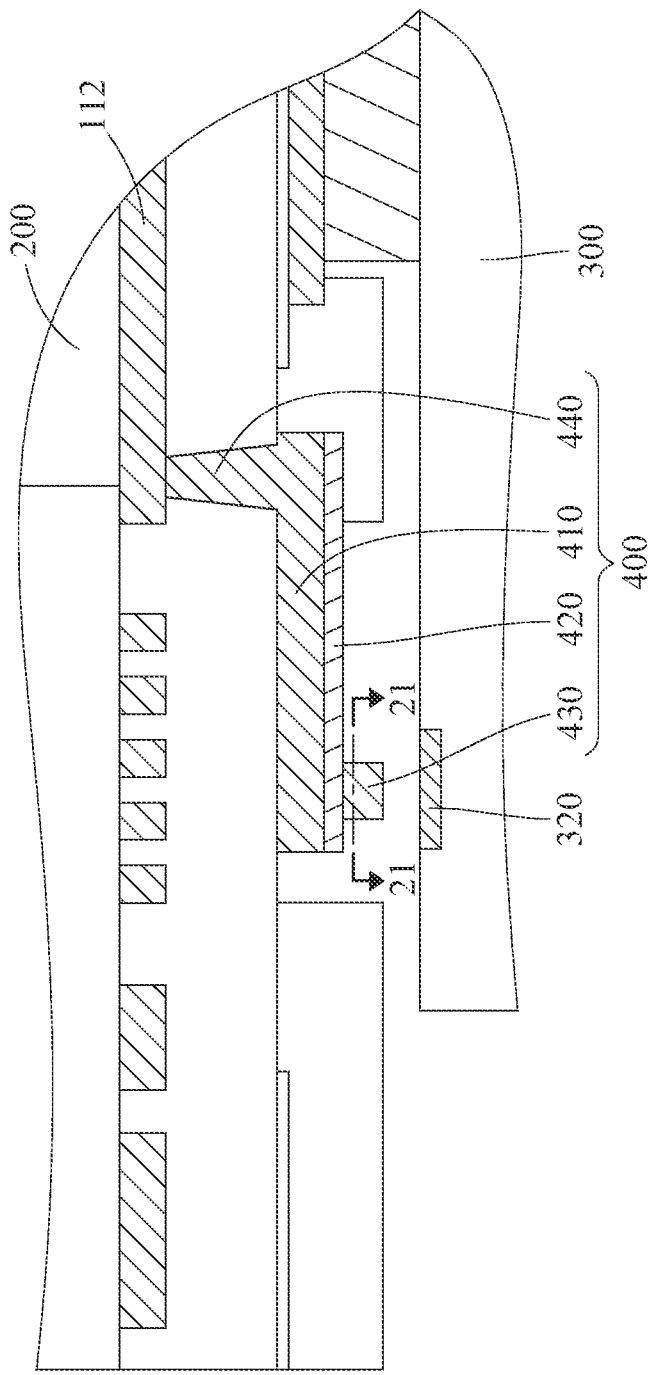
FIG. 20 is a partially enlarged cross-sectional view of the circuit board assembly in FIG. 19.
Figure 21:
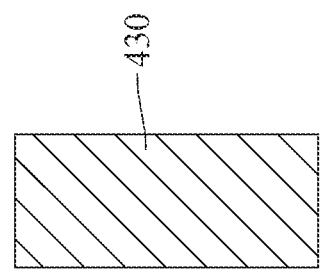
FIG. 21 is a cross-sectional view taking along line 21-21 in FIG. 20 and shows a third electrically conductive contact.

Please refer to FIGS. 20 and 21. FIG. 20 is a partially enlarged cross-sectional view of the circuit board assembly 10 in FIG. 19. FIG. 21 is a cross-sectional view of the circuit board assembly 10 taken along line 21-21 in FIG. 20 to show the third electrically conductive contact 430. In this embodiment, as shown in FIG. 20, the third electrically conductive contact 430 is in, for example, a prism shape. Further, as shown in FIG. 21, the cross-section of the prism-shaped third electrically conductive contact 430 is rectangular. That is, in this embodiment, the third electrically conductive contact 430 is in, for example, a rectangular prism shape.

Figure 22:
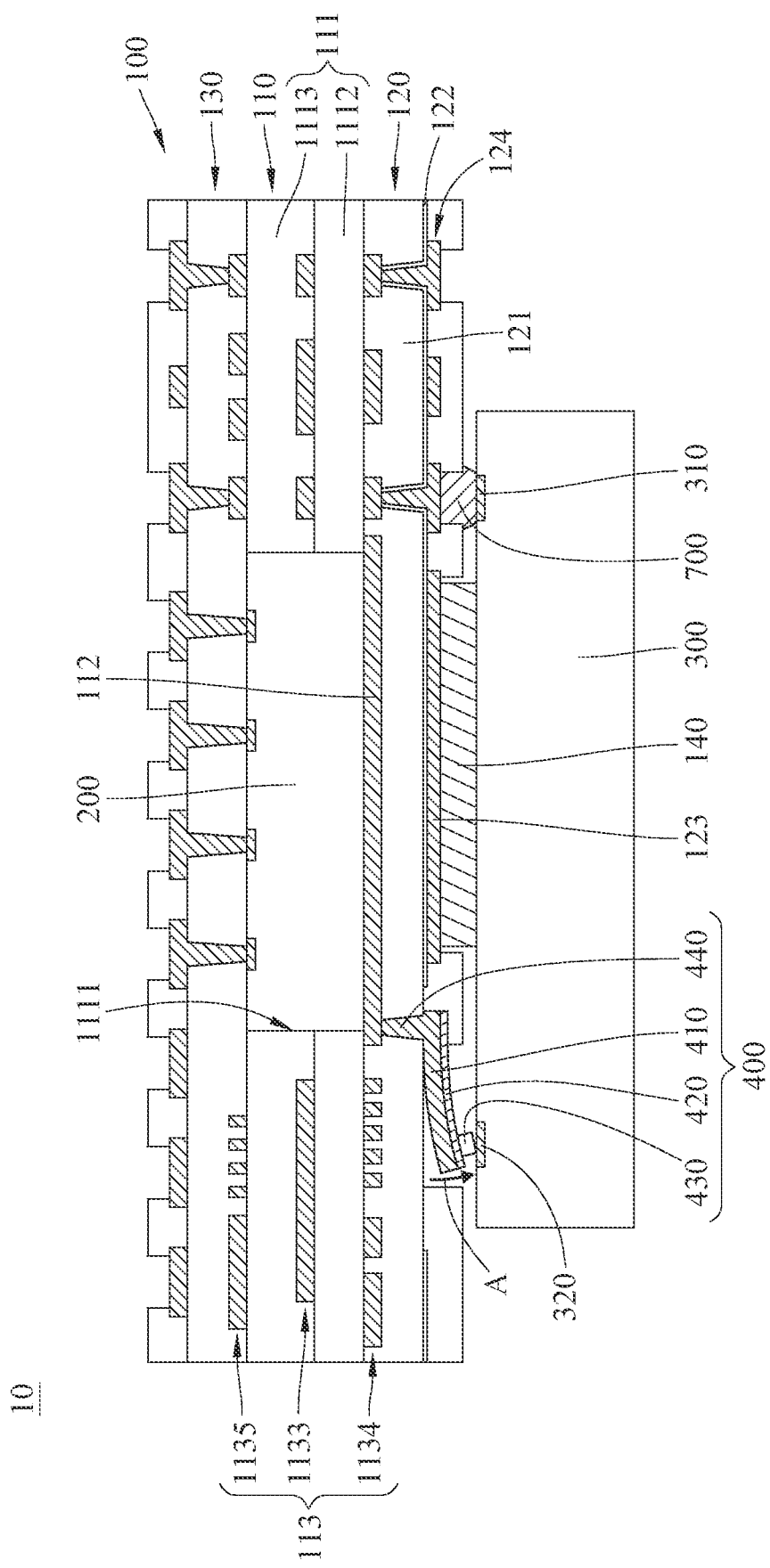
FIG. 22 is a cross-sectional view showing that a temperature switch structure of the circuit board assembly in FIG. 19 is deformed to be in contact with a second electrically conductive contact of a heat dissipation assembly.

Hereinafter, the operation of the heat dissipation assembly 300 in response to the temperature of the temperature switch structure 400 will be described with reference to FIGS. 22, where FIG. 22 is a cross-sectional view of the circuit board assembly 10 when the temperature switch structure 400 is deformed and in contact with the second electrically conductive contact 320 of the heat dissipation assembly 300. In detail, since the first metal layer 410 and the second metal layer 420 are different in thermal expansion coefficient, the first metal layer 410 and the second metal layer 420 will have different reactions to the same amount of heat. Specifically, the first metal layer 410 and the second metal layer 420 may have different levels of thermal expansion in response to the same change in temperature. In one embodiment, when the temperature switch structure 400 receives heat generated by the embedded chip 200 and the heat causes the temperature of the temperature switch structure 400 to exceed a threshold temperature, the first metal layer 410 expands more than the second metal layer 420 to force the temperature switch structure 400 to bend along a direction A, thereby allowing the third electrically conductive contact 430 to be in contact with and electrically connected to the second electrically conductive contact 320 of the heat dissipation assembly 300. Meanwhile, the first electrically conductive contact 310 of the heat dissipation assembly 300 is electrically connected to the circuit layer 124 via the solder ball 700. As such, the heat dissipation assembly 300 is turned on by being electrically connected to the electrically conductive part 113 of the circuit board 100 via the first thermally conductive part 112, and starts cooling the embedded chip 200. Note that the bonding force between the first metal layer 410 and the dielectric layer 121 is smaller than the bonding force between the circuit layer 124 and the dielectric layer 121 and the bonding force between the heat dissipation layer 123 and the dielectric layer 121. Thus, the circuit layer 124 and the heat dissipation layer 123 are firmly disposed on the dielectric layer 121 when the temperature switch structure 400 allows a part of the first metal layer 410 to be spaced apart from the dielectric layer 121 by bending along the direction A, thereby improving the reliability of the circuit board assembly 10 according to the present disclosure.

As shown in FIG. 19, when the heat dissipation assembly 300 cools the embedded chip 200, the temperature switch structure 400 is also cooled. As the temperature of the temperature switch structure 400 is lower than the threshold temperature, the first metal layer 410 contract more than the second metal layer 420 to restore the position of the temperature switch structure 400 so that the third electrically conductive contact 430 is spaced apart from the second electrically conductive contact 320 of the heat dissipation assembly 300. Accordingly, the heat dissipation assembly 300 is turned off by being electrically disconnected from the electrically conductive part 113 of the circuit board 100, and stop cooling the embedded chip 200.

Figure 23:
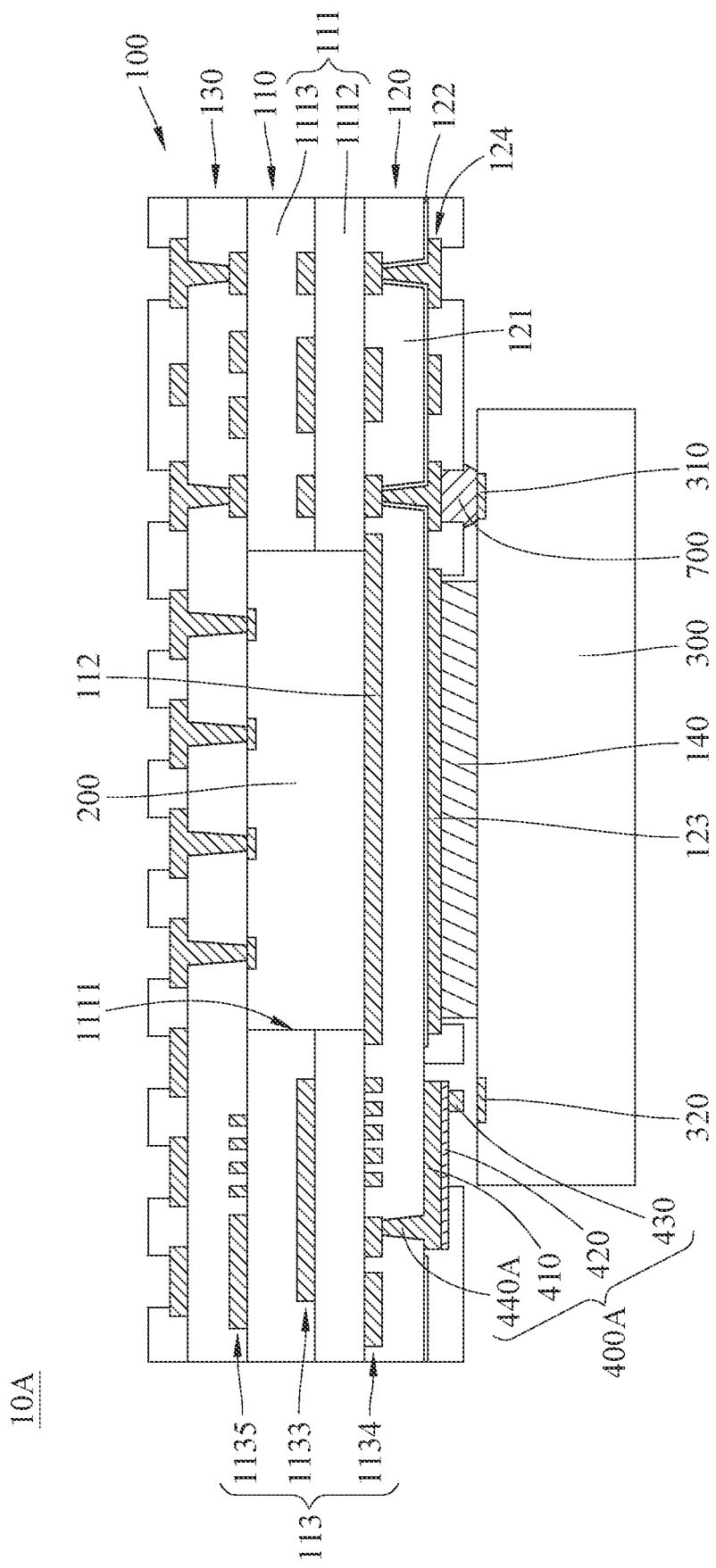
FIG. 23 is a cross-sectional view of a circuit board assembly according to a second embodiment of the disclosure.

In the circuit board assembly 10 according to the first embodiment of the disclosure shown in FIG. 19, the thermally conductive via 440 is in thermal contact with the first thermally conductive part 112 that is in direct contact with the embedded chip 200, but the disclosure is not limited thereto. Please refer to FIG. 23. FIG. 23 is a cross-sectional view of a circuit board assembly 10A according to a second embodiment of the disclosure. Note that the main difference between the circuit board assembly 10A according to the second embodiment of the disclosure and the circuit board assembly 10 according to the first embodiment of the disclosure in FIG. 19 is the position of the thermally conductive via 440. The circuit board assembly 10A according to the second embodiment of the disclosure may also include the circuit board 100, the embedded chip 200 and the heat dissipation assembly 300 according to the first embodiment shown in FIG. 19, and other features of a temperature switch structure 400A according to the second embodiment of the disclosure may be understood by referring to the related descriptions of the temperature switch structure 400 in FIG. 19. Specifically, in this embodiment, the circuit board 100 includes the substrate 110, the first build-up layer 120, the second build-up layer 130 and the heat dissipation block 140. The substrate 110 includes the electrically insulating part 111, the first thermally conductive part 112 and the electrically conductive part 113. The electrically insulating part 111 includes insulating layers 1112 and 1113, and has a recess 1111. The electrically conductive part 113 includes the circuit layers 1133, 1134 and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 that is electrically connected to the circuit layer 124 via the solder ball 700. The temperature switch structure 400A includes the first metal layer 410, the second metal layer 420, the third electrically conductive contact 430 and a thermally conductive via 440A. Hereinafter, only the position of the thermally conductive via 440A will be described in detail, and the repeated descriptions will be omitted. In this embodiment, the thermally conductive via 440A is connected to a part of the electrically conductive part 113 (i.e., a part of the circuit layer 1134), and a part of the electrically conductive part 113 is spaced apart from the embedded chip 200. Further, a part of the electrically conductive part 113 (i.e., a part of the circuit layer 1134) is in thermal contact with the thermally conductive via 440A and is spaced apart from the embedded chip 200. Accordingly, a part of the circuit layer 1134 that is in thermal contact with the thermally conductive via 440A transfers heat to the first thermally conductive part 112 via the dielectric layer 121 having lower thermal conductivity than the first thermally conductive part 112, and then to the embedded chip 200. Thus, the heat transfer efficiency between the temperature switch structure 400B and the embedded chip 200 is decreased, thereby reducing the sensitivity of turning on or turning off the heat dissipation assembly 300.

Figure 24:
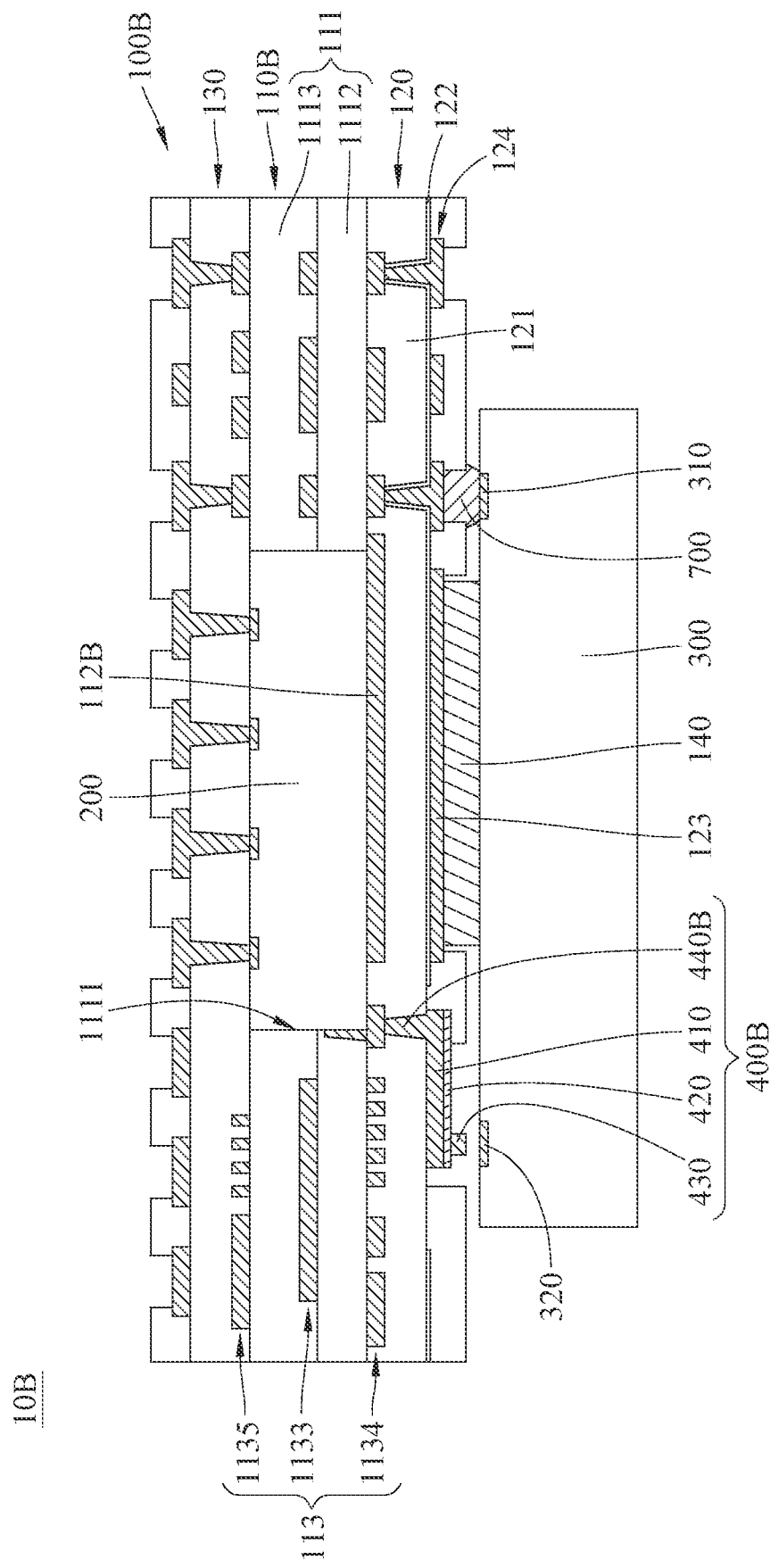
FIG. 24 is a cross-sectional view of a circuit board assembly according to a third embodiment of the disclosure.

In the circuit board assembly 10 according to the first embodiment of the disclosure shown in FIG. 19, the thermally conductive via 440 is in thermal contact with the first thermally conductive part 112 that is in direct contact with the embedded chip 200, and the electrically conductive part 113 (circuit layer 1134) is spaced apart from the embedded chip 200, but the disclosure is not limited thereto. Please refer to FIG. 24. FIG. 24 is a cross-sectional view of a circuit board assembly 10B according to a third embodiment of the disclosure. Note that the main differences between the circuit board assembly 10B according to the third embodiment of the disclosure and the circuit board assembly 10 according to the first embodiment of the disclosure in FIG. 19 are positions of a thermally conductive via 440B, an electrically conductive part 113B (a circuit layer 1134B) and a first thermally conductive part 112B. The circuit board assembly 10B according to the third embodiment of the disclosure may include the embedded chip 200 and the heat dissipation assembly 300 according to the first embodiment shown in FIG. 19, and other features of the temperature switch structure 400B and the circuit board 100B according to the third embodiment of the disclosure may be understood by referring to the related descriptions of the temperature switch structure 400 and those of the circuit board 100 in FIG. 19. In this embodiment, a circuit board 100B includes a substrate 110B, the first build-up layer 120, the second build-up layer 130 and the heat dissipation block 140. The substrate 110B includes the electrically insulating part 111, the first thermally conductive part 112B and the electrically conductive part 113B. The electrically insulating part 111 includes the insulating layers 1112 and 1113, and has the recess 1111. The electrically conductive part 113B includes circuit layers 1133, 1134B and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400B includes the first metal layer 410, the second metal layer 420, the third electrically conductive contact 430 and the thermally conductive via 440B. Hereinafter, only the positions of the thermally conductive via 440B, the electrically conductive part 113B (circuit layer 1134B) and the first thermally conductive part 112B will be described in detail, and the repeated descriptions will be omitted. In this embodiment, the thermally conductive via 440B is spaced apart from the first thermally conductive part 112B. In this embodiment, the thermally conductive via 440B is connected to a part of the electrically conductive part 113B (i.e., a part of the circuit layer 1134B), and a part of the electrically conductive part 113B is in direct contact with the embedded chip 200. Further, a part of the electrically conductive part 113B (a part of the circuit layer 1134B) is in thermal contact with the thermally conductive via 440B, and is in direct contact with the embedded chip 200. Thus, the heat transfer efficiency between the temperature switch structure 400B and the embedded chip 200 are increased, thereby enhancing the sensitivity of turning on and turning off the heat dissipation assembly 300.

Figure 25:
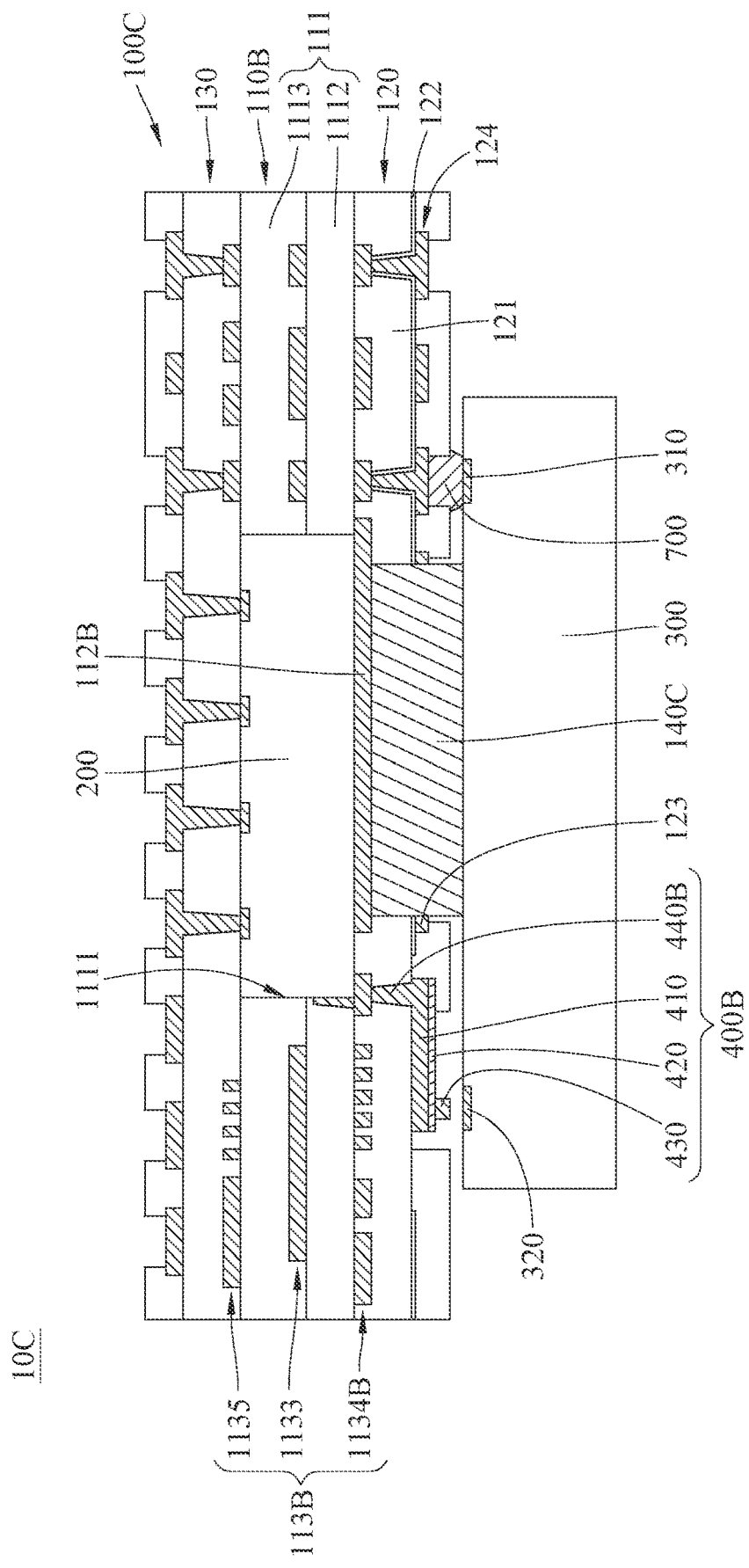
FIG. 25 is a cross-sectional view of a circuit board assembly according to a fourth embodiment of the disclosure.

The heat dissipation block is not limited to be stacked on a side of the heat dissipation layer that is located farthest away from the first build-up layer. Please refer to FIG. 25. FIG. 25 is a cross-sectional view of a circuit board assembly 10C according to a fourth embodiment of the disclosure. Note that the main difference between the circuit board assembly 10C according to the fourth embodiment of the disclosure and the circuit board assembly 10B according to the third embodiment in FIG. 24 is the position of the heat dissipation block. The circuit board assembly 10C according the fourth embodiment of the disclosure may include the embedded chip 200 and the heat dissipation assembly 300 according to the first embodiment shown in FIG. 19 and the temperature switch structure 400B according to the third embodiment of the disclosure shown in FIG. 24, and other features of the circuit board 100C according to the fourth embodiment of the disclosure may be understood by referring to the relation descriptions of the circuit board 100 in FIG. 19 and those of the circuit board 100B in FIG. 24. In this embodiment, the circuit board 100C includes the substrate 110B, the first build-up layer 120, the second build-up layer 130 and a heat dissipation block 140C. The substrate 110B includes the electrically insulating part 111, the first thermally conductive part 112B and the electrically conductive part 113B. The electrically insulating part 111 includes the insulating layers 1112 and 1113, and has the recess 1111. The electrically conductive part 113B includes the circuit layers 1133, 1134B and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400B includes the first metal layer 410, the second metal layer 420, the third electrically conductive contact 430 and the thermally conductive via 440B. Hereinafter, only the position of the heat dissipation block 140C will be described in detail, and the repeated descriptions will be omitted. In this embodiment, the heat dissipation block 140C penetrates through the heat dissipation layer 123, the adhesive layer 122 and the dielectric layer 121 of the first build-up layer 120, and two opposite sides of the heat dissipation block 140C are in thermal contact with the first thermally conductive part 112 and the heat dissipation assembly 300, respectively. Thus, the heat transfer efficiency between the embedded chip 200 and the heat dissipation assembly 300 is increased. In addition, in this embodiment, the heat dissipation block 140C is spaced apart from the temperature switch structure 400B so that two separate heat dissipation paths are provided between the embedded chip 200 and the heat dissipation assembly 300 by the heat dissipation block 140C and the temperature switch structure 400B. Therefore, the heat transfer efficiency between the embedded chip 200 and the heat dissipation assembly 300 is increased without affecting the deformation of the temperature switch structure 400B (i.e., the operation of turning on or turning off the heat dissipation assembly 300 by the temperature switch structure 400B).

Figure 26:
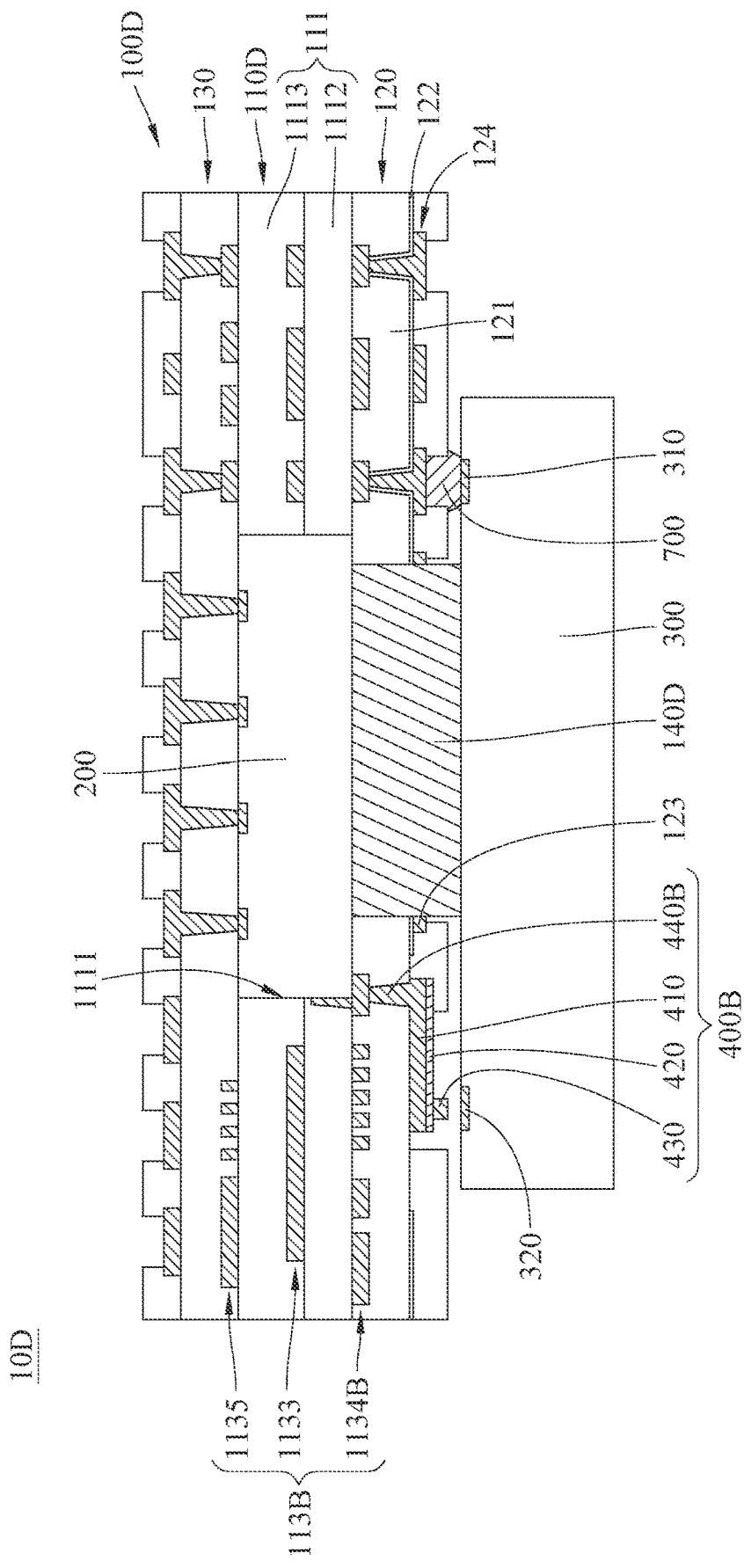
FIG. 26 is a cross-sectional view of a circuit board assembly according to a fifth embodiment of the disclosure.

Alternatively, please refer to FIG. 26. FIG. 26 is a cross-sectional view of a circuit board assembly 10D according to a fifth embodiment of the disclosure. Note that the main difference between the circuit board assembly 10D according to the fifth embodiment of the disclosure and the circuit board assembly 10B according to the third embodiment of the disclosure is the position of the heat dissipation block. The circuit board assembly 10D according to the fifth embodiment of the disclosure may include the embedded chip 200 and the heat dissipation assembly 300 according to the first embodiment shown in FIG. 19 and the temperature switch structure 400B according to the third embodiment shown in FIG. 24, and other features of a circuit board 100D according to the fifth embodiment of the disclosure may be understood by referring to the related descriptions of the circuit board 100 in FIG. 19 and those of the circuit board 100B in FIG. 24. In this embodiment, the circuit board 100D includes a substrate 110D, the first build-up layer 120, the second build-up layer 130 and a heat dissipation block 140D. The substrate 110D includes the electrically insulating part 111 and the electrically conductive part 113B. The electrically insulating part 111 includes the insulating layer 1112 and 1113, and has the recess 1111. The electrically conductive part 113B includes the circuit layers 1133, 1134B and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400B includes the first metal layer 410, the second metal layer 420, the third electrically conductive contact 430 and the thermally conductive via 440B. Hereinafter, only the position of the heat dissipation block 140D will be described in detail, and the repeated descriptions will be omitted. In this embodiment, the substrate 110D of the circuit board 100D does not include the first thermally conductive part 112 in FIG. 19, the heat dissipation block 140D penetrates through the heat dissipation layer 123, the adhesive layer 122 and the dielectric layer 121 of the first build-up layer 120, and two opposite sides of the heat dissipation block 140D are in thermal contact with the embedded chip 200 and the heat dissipation assembly 300, respectively.

Figure 27:
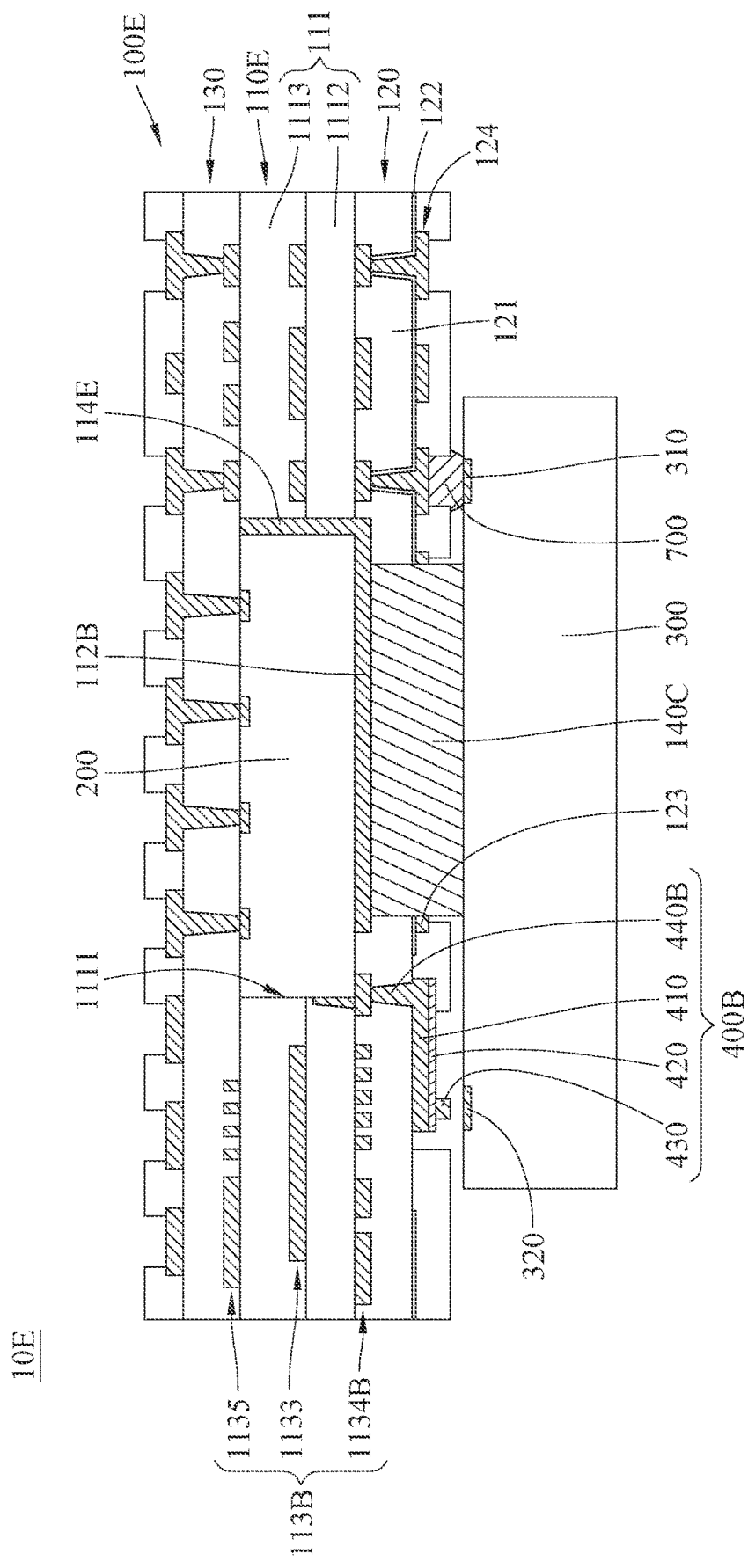
FIG. 27 is a cross-sectional view of a circuit board assembly according to a sixth embodiment of the disclosure.

Please refer to FIG. 27. FIG. 27 is a cross-sectional view of a circuit board assembly 10E according to a sixth embodiment of the disclosure. Note that the main difference between the circuit board assembly 10E according to the sixth embodiment of the disclosure and the circuit board assembly 10C according to the fourth embodiment of the disclosure in FIG. 25 is that a substrate 110E of the circuit board assembly 10E according to the sixth embodiment of the disclosure further includes a second heat dissipation part 114E. The circuit board assembly 10E according to the sixth embodiment of the disclosure may include the embedded chip 200 and the heat dissipation assembly 300 according to the first embodiment of the disclosure in FIG. 19, the temperature switch structure 400B according to the third embodiment of the disclosure in FIG. 24, and the circuit board 100C according to the fifth embodiment of the disclosure in FIG. 25, and other features of the circuit board 100E according to the sixth embodiment of the disclosure may be understood by referring to the related descriptions of the circuit board 100 in FIG. 19 and those of the circuit board 100C in FIG. 25. In this embodiment, the circuit board 100E includes the substrate 110E, the first build-up layer 120, the second build-up layer 130 and the heat dissipation block 140. The substrate 110E includes the electrically insulating part 111, the first thermally conductive part 112B, the electrically conductive part 113B and the second heat dissipation part 114E. The electrically insulating part 111 includes the insulating layers 1112 and 1113, and has the recess 1111. The electrically conductive part 113B includes the circuit layers 1133, 1134B and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400B includes the first metal layer 410, the second metal layer 420, the third electrically conductive contact 430 and the thermally conductive via 440B. Hereinafter, only the second heat dissipation part 114E will be described in detail, and the repeated descriptions will be omitted. In this embodiment, the second heat dissipation part 114E is connected to the first thermally conductive part 112. Specifically, the second heat dissipation part 114E is in thermal contact with the first thermally conductive part 112. In addition, the first thermally conductive part 112 and the second heat dissipation part 114E are in thermal contact with different sides of the embedded chip 200, respectively. Thus, the thermal contact area between the circuit board 100E and the embedded chip 200 is increased, such that heat can be more efficiently transferred to the first thermally conductive part 112 and the second heat dissipation part 114E from the embedded chip 200.

Figure 28:
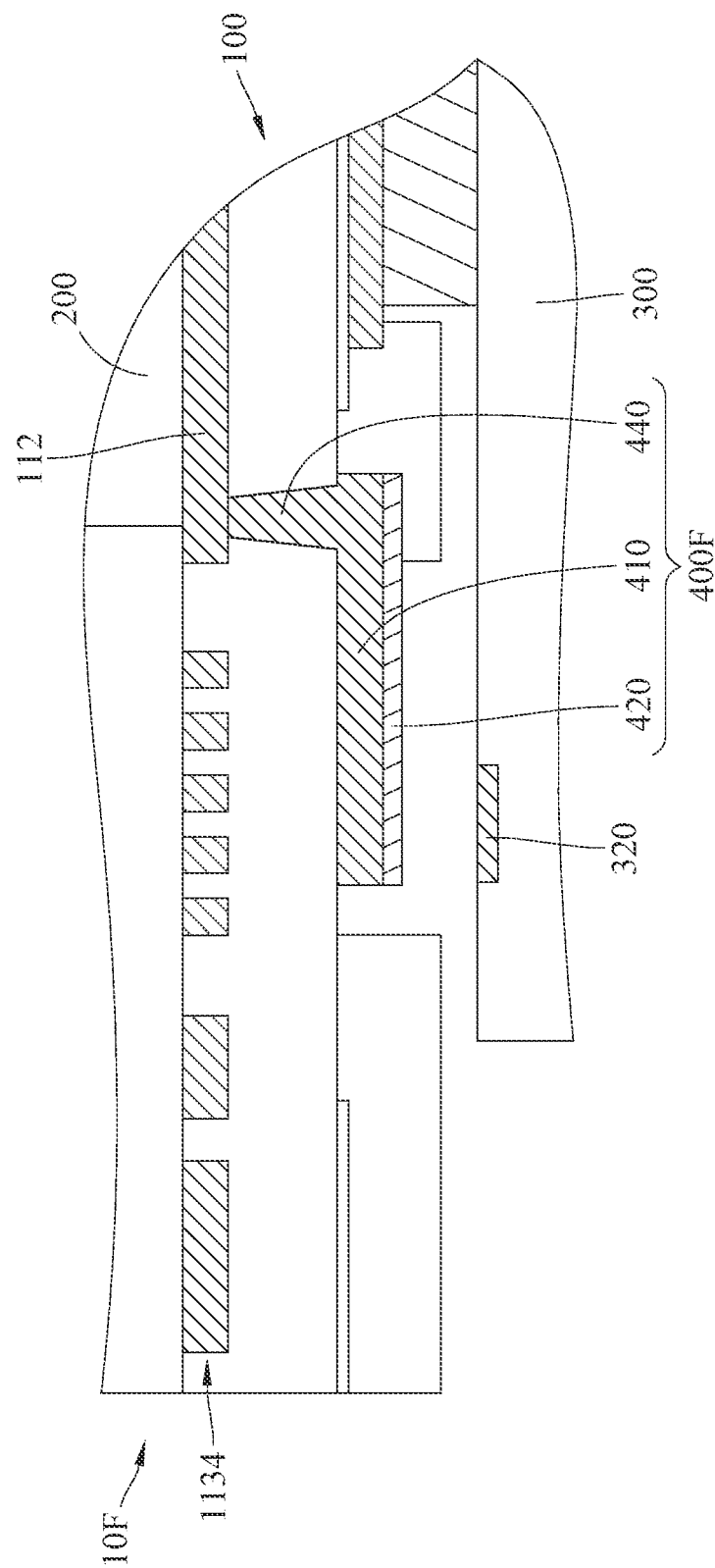
FIG. 28 is a cross-sectional view of a circuit board assembly according to a seventh embodiment of the disclosure.

The temperature switch structure according to the disclosure is not limited to include the third electrically conductive contact. Please refer to FIG. 28. FIG. 28 is a cross-sectional view of a circuit board assembly 10F according to a seventh embodiment of the disclosure. Note that the main difference between the circuit board assembly 10F according to the seventh embodiment of the disclosure and the circuit board assembly 10 according to the first embodiment of the disclosure in FIG. 19 is that a temperature switch structure 400F according to the seventh embodiment of the disclosure does not include the third electrically conductive contact 430 in FIG. 19. The circuit board assembly 10F according to the seventh embodiment of the disclosure may include the circuit board 100, the embedded chip 200 and the heat dissipation assembly 300 according to the first embodiment of the disclosure in FIG. 19, and other features of the temperature switch structure 400F according to the seventh embodiment of the disclosure may be understood by referring to the related descriptions of the temperature switch structure 400 in FIG. 19. In this embodiment, the circuit board 100 includes the circuit layer 1134 and the first thermally conductive part 112. The heat dissipation assembly 300 includes the second electrically conductive contact 320. The temperature switch structure 400F includes the first metal layer 410, the second metal layer 420 and the thermally conductive via 440. Hereinafter, only the feature that the temperature switch structure 400F does not include the third electrically conductive contact 430 in FIG. 19 and the related features will be described in detail, and the repeated descriptions will be omitted. In this embodiment, the temperature switch structure 400F does not include the third electrically conductive contact 430 in FIG. 19. Further, in this embodiment, a side of the second metal layer 420 that is located farthest away from the first metal layer 410 is configured to be in contact with or spaced apart from the second electrically conductive contact 320 of the heat dissipation assembly 300.

Figure 29:
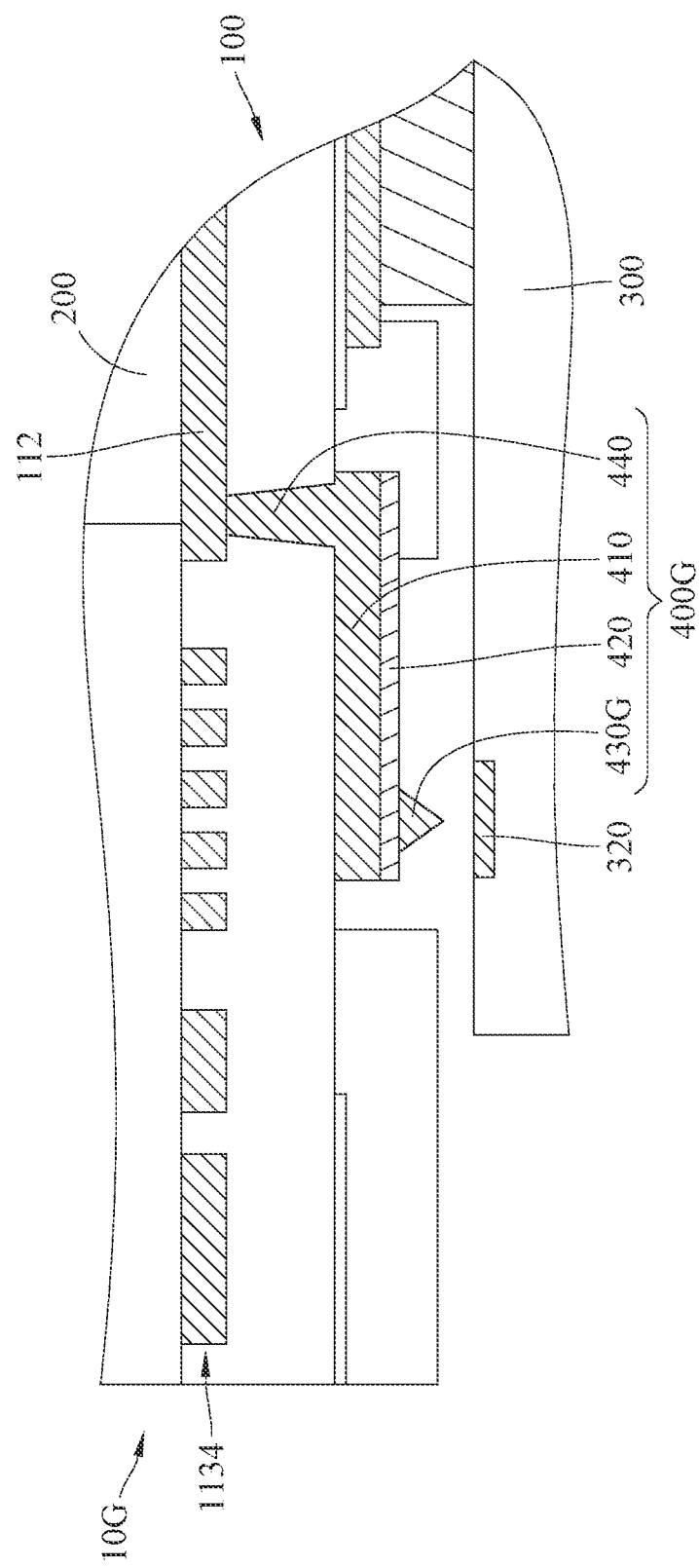
FIG. 29 is a cross-sectional view of a circuit board assembly according to an eighth embodiment of the disclosure.

The third electrically conductive contact of the temperature switch structure according to the disclosure is not limited to be in a prism shape. Please refer to FIG. 29. FIG. 29 is a cross-sectional view of a circuit board assembly 10G according to an eighth embodiment of the disclosure. Note that the main difference between the circuit board assembly 10G according to the eighth embodiment of the disclosure and the circuit board assembly 10 according to the first embodiment in FIG. 19 is the shape of the third electrically conductive contact 430 of the temperature switch structure 400. The circuit board assembly 10G according to the eighth embodiment may include the circuit board 100, the embedded chip 200 and the heat dissipation assembly 300 according to the first embodiment of the disclosure in FIG. 19, and other features of a temperature switch structure 400G according to the eighth embodiment of the disclosure may be understood by referring to related descriptions of the temperature switch structure 400 in FIG. 19. In this embodiment, the circuit board 100 includes the circuit layer 1134 and the first thermally conductive part 112. The heat dissipation assembly 300 includes the second electrically conductive contact 320. The temperature switch structure 400G includes the first metal layer 410, the second metal layer 420, a third electrically conductive contact 430G and the thermally conductive via 440. Hereinafter, only the shape of the third electrically conductive contact 430G of the temperature switch structure 400G will be described in detail, and the repeated descriptions will be omitted. In this embodiment, the third electrically conductive contact 430G of the temperature switch structure 400G is in, for example, a cone shape.

Figure 30A:
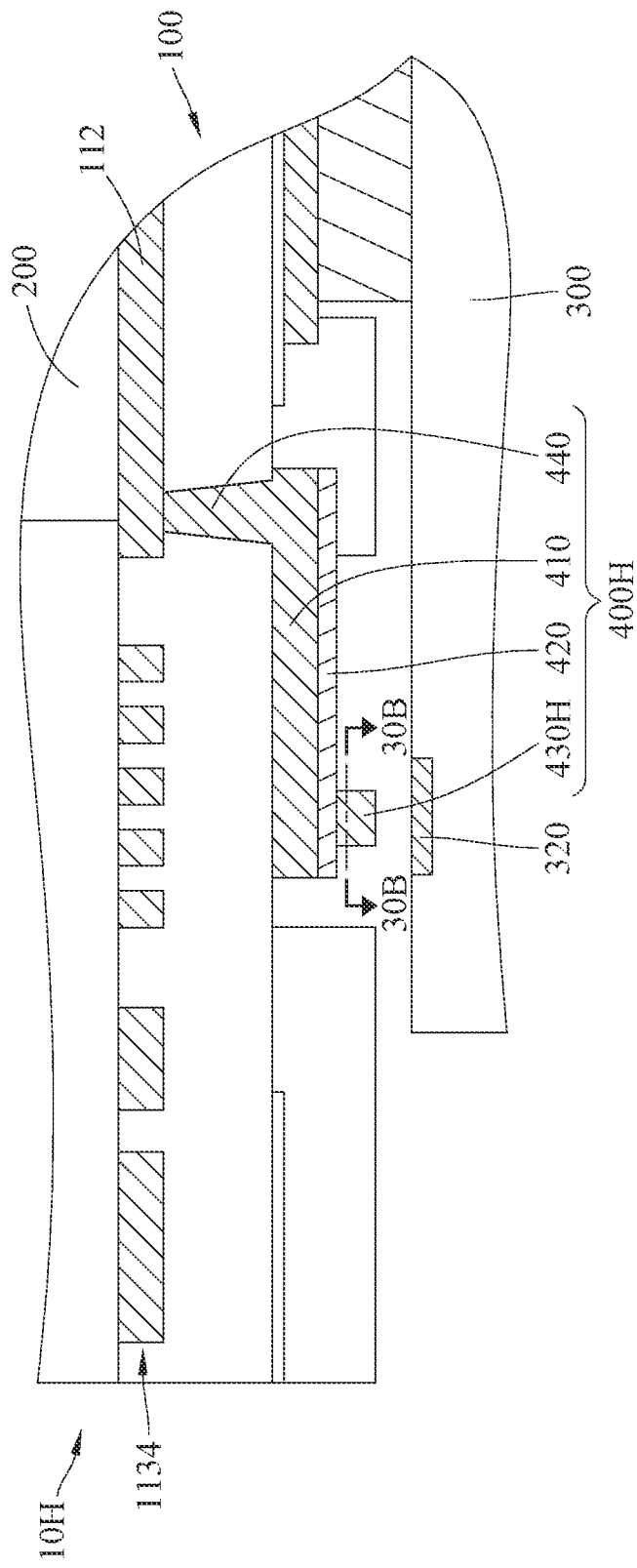
FIG. 30A is a cross-sectional view of a circuit board assembly according to a ninth embodiment of the disclosure.
Figure 30B:
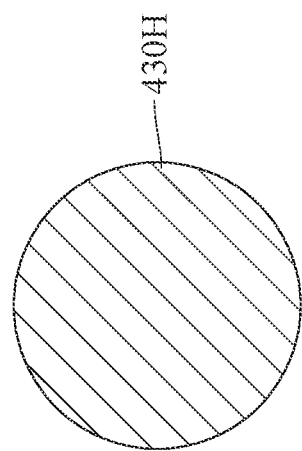
FIG. 30B is a cross-sectional view of a third electrically conductive contact taking along line 30B-30B in FIG. 30A.

The prism-shaped third electrically conductive contact of the temperature switch structure according to the disclosure is not limited to have rectangular cross-section. Please refer to FIGS. 30A and 30B. FIG. 30A is a cross-sectional view of a circuit board assembly 10H according to a ninth embodiment of the disclosure. FIG. 30B is a cross-sectional view of a third electrically conductive contact taking along line 30B-30B in FIG. 30A. Note that the main difference between the circuit board assembly 10H according to ninth embodiment of the disclosure and the circuit board assembly 10 according to the first embodiment of the disclosure in FIG. 19 is the shape of the cross-section of the prism-shaped third electrically conductive contact 430 of the temperature switch structure 400. The circuit board assembly 10H according to the ninth embodiment of the disclosure may include the circuit board 100, the embedded chip 200 and the heat dissipation assembly 300 according to the first embodiment in FIG. 19, and other features of a temperature switch structure 400H according to the ninth embodiment of the disclosure may be understood by referring to related descriptions of the temperature switch structure 400 in FIG. 19. In this embodiment, the circuit board 100 includes the circuit layer 1134 and the first thermally conductive part 112. The heat dissipation assembly 300 includes the second electrically conductive contact 320. The temperature switch structure 400H includes the first metal layer 410, the second metal layer 420, a third electrically conductive contact 430H and the thermally conductive via 440. Hereinafter, only the shape of the cross-section of the prism-shaped third electrically conductive contact 430H of the temperature switch structure 400H will be described, and the repeated descriptions will be omitted. In this embodiment, the cross-section of the prism-shaped third electrically conductive contact 430H of the temperature switch structure 400H is, for example, circular. That is, in this embodiment, the third electrically conductive contact 430H is in a cylindrical shape.

Figure 31:
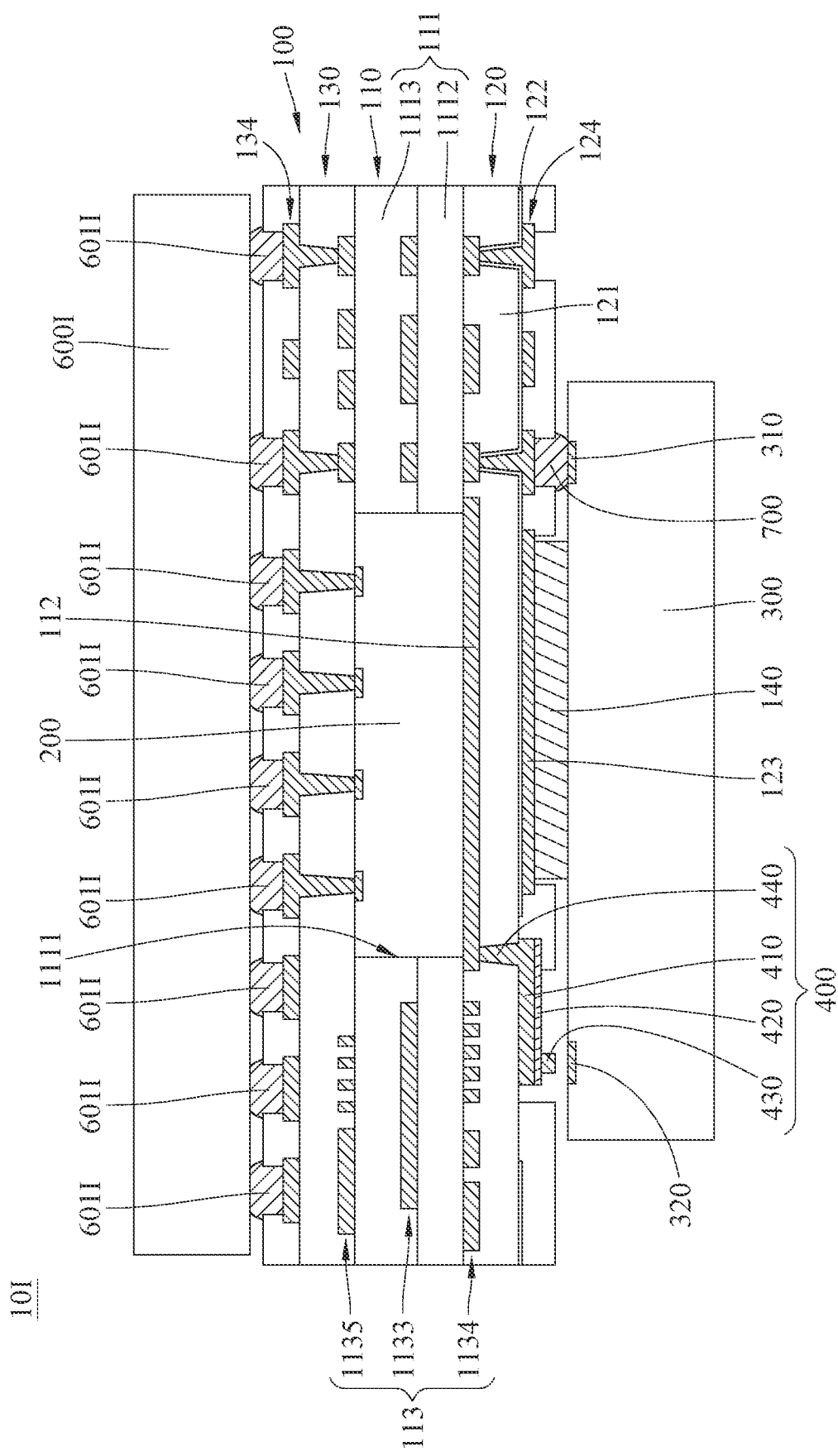
FIG. 31 is a cross-sectional view of a circuit board assembly according to a tenth embodiment of the disclosure.

Please refer to FIG. 31. FIG. 31 is a cross-sectional view of a circuit board assembly 10I according to a tenth embodiment of the disclosure. Note that the main difference between the circuit board assembly 10I according to the tenth embodiment of the disclosure and the circuit board assembly 10 according to the first embodiment of the disclosure in FIG. 19 is that the circuit board assembly 10I according to the tenth embodiment of the disclosure further includes an outer chip 6001. The circuit board assembly 10I according to the tenth embodiment of the disclosure may include the circuit board 100, the embedded chip 200, the heat dissipation assembly 300 and the temperature switch structure 400 according to the first embodiment of the disclosure in FIG. 19. In this embodiment, the circuit board 100 includes the substrate 110, the first build-up layer 120, the second build-up layer 130 and the heat dissipation block 140. The substrate 110 includes the electrically insulating part 111, the first thermally conductive part 112 and the electrically conductive part 113. The electrically insulating part 111 includes the insulating layers 1112 and 1113, and has the recess 1111. The electrically conductive part 113 includes the circuit layers 1133, 1134 and 1135. The first build-up layer 120 includes the dielectric layer 121, the adhesive layer 122, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400 includes the first metal layer 410, the second metal layer 420, the third electrically conductive contact 430 and the thermally conductive via 440. Hereinafter, only the outer chip 6001 will be described in detail, and the repeated descriptions will be omitted. In this embodiment, the outer chip 6001 is disposed on a side of the second build-up layer 130 that is located farthest away from the substrate 110. In addition, in this embodiment, the outer chip 6001 includes a plurality of solder balls 6011 such as tin solder balls, and the outer chip 6001 is electrically connected to the circuit layer 134 of the second build-up layer 130 via the solder balls 6011.

Figure 32:
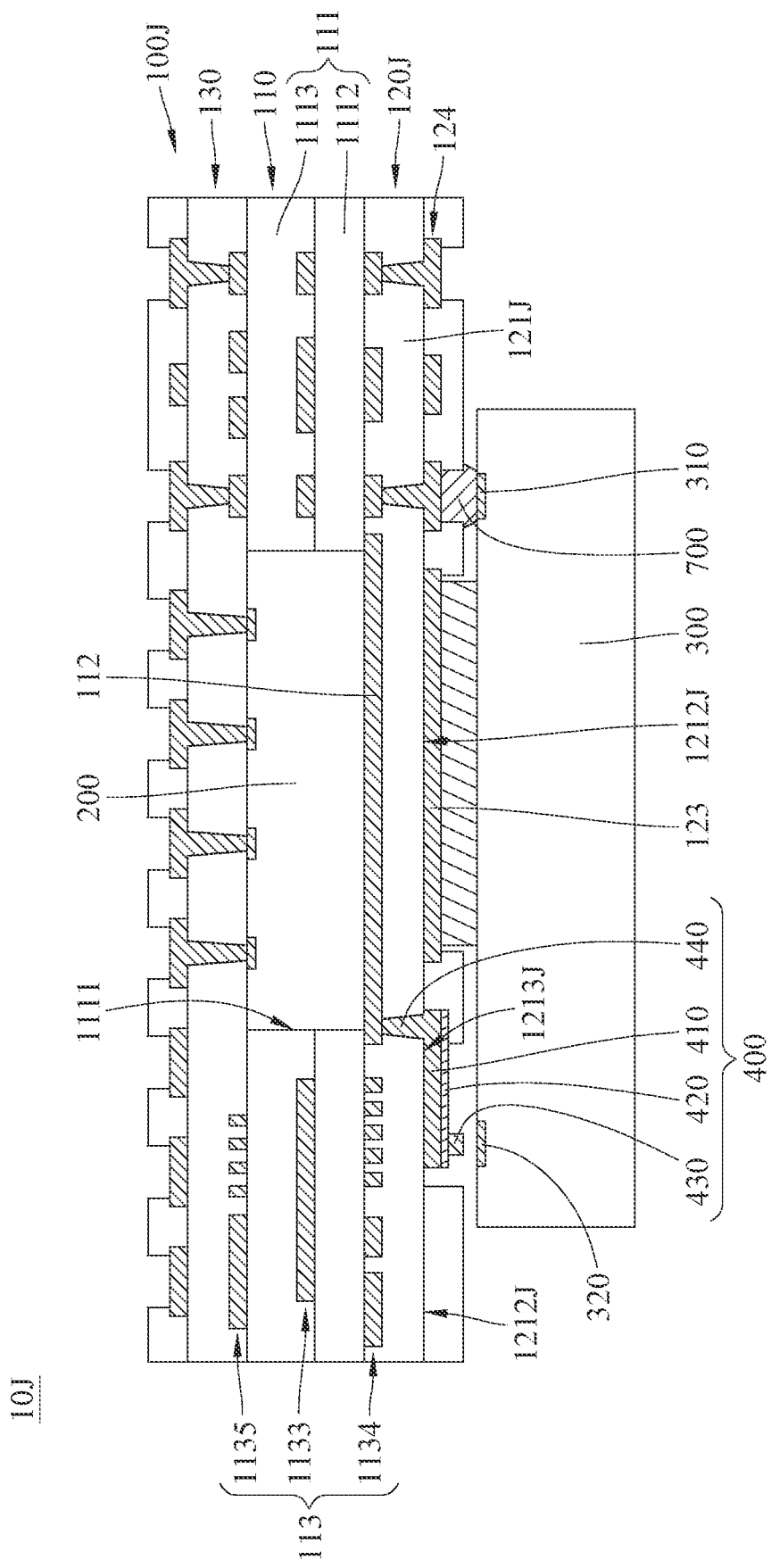
FIG. 32 is a cross-sectional view of a circuit board assembly according to an eleventh embodiment of the disclosure.

Please again refer to FIGS. 12 and 19, in the first embodiment, the bonding enhancement process includes a step of forming the adhesive layer 122 on the first area 1212 of the dielectric layer 121 so that the bonding force between the first metal layer 410 and the dielectric layer 121 is smaller than the bonding force between the circuit layer 124 and the dielectric layer 121 and the bonding force between the heat dissipation layer 123 and the dielectric layer 121. However, the disclosure is not limited to enhance the bonding force by disposing the adhesive layer 122. In other embodiments, the bonding enhancement process may include performing a surface treatment on the first area of the dielectric layer to increase the surface roughness of the first area, thereby allowing the bonding force between the first metal layer and the dielectric layer to be smaller than the bonding force between the circuit layer and the dielectric layer and the bonding force between the heat dissipation layer and the dielectric layer. For example, except that the step of disposing the adhesive layer 122 in FIG. 12 is replaced by a step of performing the surface treatment on the first area of the dielectric layer, the circuit board assembly 10J in FIG. 32 is manufactured by performing the method of manufacturing the circuit board assembly according to the first embodiment of the disclosure in FIGS. 1 to 19 in the same or similar manner. Please refer to FIG. 32. FIG. 32 is a cross-sectional view of a circuit board assembly 10J according to an eleventh embodiment of the disclosure. Note that the main difference between the circuit board assembly 10J according to the eleventh embodiment of the disclosure and the circuit board assembly 10 according to the first embodiment of the disclosure in FIG. 19 is that a first build-up layer 120J according to the eleventh embodiment of the disclosure does not include the adhesive layer 122 in FIG. 19. The circuit board assembly 10J according to the eleventh embodiment of the disclosure may include the embedded chip 200, the heat dissipation assembly 300 and the temperature switch structure 400 according to the first embodiment of the disclosure in FIG. 19, and other features of a circuit board 100J may be understood by referring to related descriptions of the circuit board 100 in FIG. 19. In this embodiment, the circuit board 100 includes the substrate 110, the first build-up layer 120J, the second build-up layer 130 and the heat dissipation block 140. The substrate 110 includes the electrically insulating part 111, the first thermally conductive part 112 and the electrically conductive part 113. The electrically insulating part 111 includes the insulating layers 1112 and 1113, and has the recess 1111. The electrically conductive part 113 includes the circuit layers 1133, 1134 and 1135. The first build-up layer 120J includes a dielectric layer 121J, the heat dissipation layer 123 and the circuit layer 124. The heat dissipation assembly 300 includes the second electrically conductive contact 320 and the first electrically conductive contact 310 electrically connected to the circuit layer 124 via the solder ball 700. The temperature switch structure 400 includes the first metal layer 410, the second metal layer 420, the third electrically conductive contact 430 and the thermally conductive via 440. Hereinafter, only the feature that the first build-up layer 120J of the circuit board 100J does not include the adhesive layer 122 in FIG. 19 and the related contents will be described in detail, and the repeated descriptions will be omitted. In this embodiment, the first build-up layer 120J of the circuit board 100J does not include the adhesive layer 122 in FIG. 19. In addition, in this embodiment, a surface roughness of the first area 1212J of the dielectric layer 121J is greater than a surface roughness of the second area 1213J of the dielectric layer 121J. Thus, a bonding force between the first metal layer 410 and the second area 1213J of the dielectric layer 121J is smaller than a bonding force between the circuit layer 124 and the first area 1212J of the dielectric layer 121J and a bonding force between the heat dissipation layer 123 and the first area 1212J of the dielectric layer 121J.

According to the circuit board assembly and the manufacturing method thereof disclosed by above embodiments, the thermal expansion coefficient of the first metal layer is different from the thermal expansion coefficient of the second metal layer, and the first metal layer is thermally coupled to the embedded chip. Thus, the temperature switch structure is deformed in response to the temperature change of the embedded chip to be in contact with or spaced apart from the second electrically conductive contact of the heat dissipation assembly. Specifically, the temperature switch structure is in contact with the second electrically conductive contact when the temperature of the embedded chip is high to turn on the heat dissipation assembly to start cooling the embedded chip. The temperature switch structure is spaced apart from the second electrically conductive contact when the temperature of the embedded chip is low to turn off the heat dissipation assembly to stop cooling the embedded chip. Accordingly, the heat dissipation assembly can be turned on and turned off in response to the temperature change of the embedded chip without any temperature sensor or complex control system, thereby achieving an efficacy of low cost and energy saving and prolonging the lifespan of the heat dissipation assembly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A circuit board assembly, comprising:
   a circuit board;
   an embedded chip embedded in and electrically connected to the circuit board;
   a heat dissipation assembly disposed on the circuit board and having a first electrically conductive contact and a second electrically conductive contact, wherein the heat dissipation assembly is thermally coupled to the embedded chip, and the first electrically conductive contact of the heat dissipation assembly is electrically connected to the circuit board; and
   a temperature switch structure located between at least a part of the circuit board and the second electrically conductive contact, wherein the temperature switch structure comprises a first metal layer and a second metal layer stacked on each other, the first metal layer of the temperature switch structure is electrically connected to the circuit board and is thermally coupled to the embedded chip, and a thermal expansion coefficient of the first metal layer is different from a thermal expansion coefficient of the second metal layer so that the temperature switch structure is deformed in response to a temperature change of the embedded chip to be in contact with or spaced apart from the second electrically conductive contact of the heat dissipation assembly.

2. The circuit board assembly according to claim 1, wherein the circuit board comprises a substrate and a first build-up layer, the first build-up layer comprises a dielectric layer, a heat dissipation layer, and a circuit layer, the dielectric layer is disposed on the substrate, the heat dissipation layer, the circuit layer, and the first metal layer of the temperature switch structure are stacked on a side of the dielectric layer that is located farthest away from the substrate, a bonding force between the first metal layer of the temperature switch structure and the dielectric layer is smaller than a bonding force between the circuit layer and the dielectric layer and a bonding force between the heat dissipation layer and the dielectric layer, the embedded chip is embedded in the substrate, the heat dissipation assembly is thermally coupled to the heat dissipation layer, and the first electrically conductive contact of the heat dissipation assembly is electrically connected to the circuit layer.

3. The circuit board assembly according to claim 2, wherein the first metal layer of the temperature switch structure is located closer to the substrate than the second metal layer of the temperature switch structure, and the thermal expansion coefficient of the first metal layer of the temperature switch structure is larger than the thermal expansion coefficient of the second metal layer of the temperature switch structure.

4. The circuit board assembly according to claim 2, wherein the first build-up layer further comprises an adhesive layer, the adhesive layer is located between the heat dissipation layer and the dielectric layer, the adhesive layer is located between the circuit layer and the dielectric layer, and the adhesive layer is not located between the temperature switch structure and the dielectric layer.

5. The circuit board assembly according to claim 4, wherein the temperature switch structure further comprises at least one thermally conductive via disposed on the dielectric layer and connected to the first metal layer.

6. The circuit board assembly according to claim 5, wherein the substrate comprises an electrically insulating part, a first thermally conductive part and an electrically conductive part, the electrically insulating part has a recess, the embedded chip is located in the recess, the first thermally conductive part is located on a side of the recess and is in thermal contact with the embedded chip, the electrically conductive part is disposed on the electrically insulating part, and the circuit layer, and the temperature switch structure, the embedded chip, and the heat dissipation assembly are electrically connected to the electrically conductive part.

7. The circuit board assembly according to claim 6, wherein the at least one thermally conductive via is connected to a part of the electrically conductive part being in direct contact with the embedded chip.

8. The circuit board assembly according to claim 6, wherein the at least one thermally conductive via is connected to a part of the electrically conductive part being spaced apart from the embedded chip.

9. The circuit board assembly according to claim 6, wherein the substrate further comprises a second heat dissipation part connected to the first thermally conductive part, and the first thermally conductive part and the second heat dissipation part are in thermal contact with different sides of the embedded chip, respectively.

10. The circuit board assembly according to claim 6, wherein the circuit board further comprises a heat dissipation block, the heat dissipation block penetrates through the heat dissipation layer, the dielectric layer, and the adhesive layer of the first build-up layer, and two opposite sides of the heat dissipation block are in thermal contact with the first thermally conductive part and the heat dissipation assembly, respectively.

11. The circuit board assembly according to claim 4, wherein the circuit board further comprises a heat dissipation block, and two opposite sides of the heat dissipation block are in thermal contact with the heat dissipation layer of the first build-up layer and the heat dissipation assembly, respectively.

12. The circuit board assembly according to claim 11, wherein the heat dissipation block is spaced apart from the temperature switch structure.

13. The circuit board assembly according to claim 4, wherein the circuit board further comprises a heat dissipation block, the heat dissipation block penetrates through the heat dissipation layer, the adhesive layer, and the dielectric layer of the first build-up layer, and two opposite sides of the heat dissipation block are in thermal contact with the embedded chip and the heat dissipation assembly, respectively.

14. The circuit board assembly according to claim 1, wherein the temperature switch structure further comprises a third electrically conductive contact, the third electrically conductive contact protrudes from a side of the second metal layer that is located farthest away from the first metal layer, the temperature switch structure is deformed in response to the temperature change of the embedded chip to allow the third electrically conductive contact of the temperature switch structure to be in contact with or spaced apart from the second electrically conductive contact of the heat dissipation assembly.

15. The circuit board assembly according to claim 14, wherein the third electrically conductive contact is in a tapered shape or a prism shape.

16. A manufacturing method of circuit board assembly, comprising:
   providing a circuit board with an embedded chip embedded therein;
   forming a temperature switch structure on a side of the circuit board, wherein the temperature switch structure comprises a first metal layer and a second metal layer which are stacked on each other, the first metal layer of the temperature switch structure is electrically connected to the circuit board and is thermally coupled to the embedded chip, and a thermal expansion coefficient of the first metal layer is different from a thermal expansion coefficient of the second metal layer; and
   providing a heat dissipation assembly on the side of the circuit board, wherein the heat dissipation assembly is thermally coupled to the embedded chip, a first electrically conductive contact of the heat dissipation assembly is electrically connected to the circuit board, and the temperature switch structure is located between a second electrically conductive contact of the heat dissipation assembly and at least a part of the circuit board.

17. The manufacturing method of circuit board assembly according to claim 16, wherein providing the circuit board with the embedded chip embedded therein comprises:
   providing the embedded chip into a substrate of the circuit board;
   forming a dielectric layer on the substrate and defining a first area and a second area on the dielectric layer;
   performing a bonding enhancement process on the first area of the dielectric layer; and
   providing a heat dissipation layer and a circuit layer on the first area of the dielectric layer;
   wherein forming the temperature switch structure on a side of the circuit board comprises:
   forming the temperature switch structure on the second area.

18. The manufacturing method of circuit board assembly according to claim 17, wherein the bonding enhancement process comprises:
   forming an adhesive layer on the first area of the dielectric layer.

19. The manufacturing method of circuit board assembly according to claim 17, wherein the bonding enhancement process comprises:
   performing a surface treatment on the first area of the dielectric layer to increase a surface roughness of the first area.

20. The manufacturing method of circuit board assembly according to claim 17, wherein the first metal layer of the temperature switch structure is located closer to the substrate than the second metal layer of the temperature switch structure, and the thermal expansion coefficient of the first metal layer of the temperature switch structure is larger than the thermal expansion coefficient of the second metal layer of the temperature switch structure.

\* \* \* \* \*